(12) United States Patent
Shah et al.

(10) Patent No.: US 7,200,583 B1
(45) Date of Patent: *Apr. 3, 2007

(54) METHOD AND APPARATUS FOR ATTRIBUTE SELECTION

(75) Inventors: Ashish Shah, Austin, TX (US); Mark Wells, Sunnyvale, CA (US)

(73) Assignee: Trilogy Development Group, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/032,422

(22) Filed: Jan. 10, 2005

Related U.S. Application Data

(63) Continuation of application No. 08/780,600, filed on Jan. 8, 1997, now Pat. No. 6,865,524.

(51) Int. Cl.
*G06F 17/00* (2006.01)

(52) U.S. Cl. .......................... 706/47; 706/48

(58) Field of Classification Search ................ 706/47, 706/48
See application file for complete search history.

(56) References Cited

U.S. PATENT DOCUMENTS

| | | | |
|---|---|---|---|
| 4,754,410 A | 6/1988 | Leech et al. | 364/148 |
| 4,890,240 A * | 12/1989 | Loeb et al. | 706/48 |
| 5,050,091 A | 9/1991 | Rubin | 364/488 |
| 5,095,441 A | 3/1992 | Hopper et al. | 364/489 |
| 5,150,308 A | 9/1992 | Hooper et al. | 364/489 |
| 5,175,696 A | 12/1992 | Hooper et al. | 364/489 |
| 5,212,650 A | 5/1993 | Hooper et al. | 364/489 |
| 5,212,771 A | 5/1993 | Gane et al. | 395/160 |
| 5,267,175 A | 11/1993 | Hooper | 364/489 |
| 5,355,317 A | 10/1994 | Talbott et al. | 384/468 |
| 5,357,440 A | 10/1994 | Talbott et al. | 364/467 |
| 5,359,523 A | 10/1994 | Talbott et al. | 364/468 |
| 5,392,220 A | 2/1995 | van den Hamer et al. | 364/488 |
| 5,414,809 A | 5/1995 | Hogan et al. | 395/155 |
| 5,428,712 A | 6/1995 | Elad et al. | 706/46 |
| 5,452,226 A | 9/1995 | Hooper et al. | 364/489 |
| 5,500,802 A | 3/1996 | Morris et al. | 364/578 |
| 5,548,749 A | 8/1996 | Kroenke et al. | 395/155 |
| 5,745,901 A | 4/1998 | Entner et al. | 707/103 |
| 6,281,986 B1 * | 8/2001 | Form | 358/403 |
| 6,865,524 B1 * | 3/2005 | Shah et al. | 703/13 |

OTHER PUBLICATIONS

Choobineh et al, "An Expert Database Design System Based on Analysis of Forms", IEEE Transaction on Software Engineering, Feb. 1988.*

* cited by examiner

*Primary Examiner*—George Davis

(57) ABSTRACT

The invention provides a method and apparatus for selecting desired attributes for system configuration. The invention uses one or more rule sets to define rules that are met when a configuration is valid. A rule set may specify the interrelation of attribute values within a product or between two or more products. If the combination of attribute values that specify a product conform to at least one rule in each of the rule sets that apply to that product, that combination of attribute values is considered to specify a valid product. If the combination of attribute values that specify all of the products of an assembly conform to at least one rule in each of the rule sets that apply to that assembly, that combination of attribute values is considered to specify a valid assembly.

20 Claims, 24 Drawing Sheets

FIG. 5

| A | B |
|---|---|
| a1 | b1 |
| a1 | b2 |
| a2 | b2 |
| a3 | b3 |
| a3 | b1 |
| a4 | b2 |
| a5 | b3 |

FIG. 14

| B | C | E |
|---|---|---|
| b1 | c1 | e1 |
| b1 | c2 | e2 |
| b2 | c1 | e2 |
| b2 | c2 | e3 |
| b2 | c3 | e1 |
| b2 | c4 | e4 |
| b3 | c3 | e4 |
| b3 | c4 | e5 |

FIG. 15

| C | D |
|---|---|
| c1 | d1 |
| c1 | d2 |
| c2 | d3 |
| c3 | d2 |
| c3 | d3 |
| c4 | d2 |
| c4 | d1 |

FIG. 16

| F | G |
|---|---|
| f1 | g2 |
| f1 | g4 |
| f2 | g1 |
| f2 | g3 |
| f3 | g2 |
| f4 | g3 |

FIG. 17

|  A  |  B  |  C  |
|-----|-----|-----|
| a1  | b1  | c2  |
| a1  | b2  | c1  |
| a1  | b3  | c3  |

FIG. 18

|  B  |  C  |  D  |
|-----|-----|-----|
| b1  | c1  | d1  |
| b2  | c2  | d2  |
| b3  | c3  | d3  |

FIG. 19

METHOD AND APPARATUS FOR ATTRIBUTE SELECTION

This application is a continuation of application Ser. No. 08/780,600, filed Jan. 8, 1997 now U.S. Pat. No. 6,865,524, which is hereby incorporated by reference in its entirety.

BACKGROUND OF THE INVENTION

1. Field of the Invention

This invention relates to a method and apparatus for selecting attributes and their values.

2. Background Art

A system is comprised of components. Before a system can be built, the components of the system must be identified. To configure a system, a user must select a combination of components that are all compatible with one another. One who is knowledgeable about systems and their components defines a system. Thus, for example, an automobile salesperson assists an automobile buyer in determining the type and features of an automobile. The salesperson understands the features and options that are available to create a valid configuration. Some features and options cannot be combined. The selection of some features results in other features being unavailable. Without the assistance of a knowledgeable salesperson, it would be difficult for a buyer to identify appropriate combinations of components and to verify that they result in a valid configuration.

Computer systems have been developed to assist one in configuring a system. However, these systems sometimes use a configuration language to define a system. Like a programming language, a configuration language uses a syntax that must be understood by a user who is maintaining the data (i.e., a data maintainer). This limits the number of users who are able to use the configuration systems. That is, the level of sophistication needed to communicate with the configuration system (through the configuration language) results in less sophisticated users being unable to use the system.

In addition, configuration systems impose a flow or ordering to the user operations. For example, a user is often required to remove components from the system in reverse of the order in which they were chosen. Thus, in the course of removing an unwanted component from a configuration, a user may be forced to remove other components that the user wants to keep in the configuration. A novice user may have to perform many removal operations before achieving an acceptable configuration. If the novice user is required to remove components in a preset order, the user can become frustrated or confused and abort the configuration process.

Some systems are designed for a more sophisticated user possessing knowledge of the system to be configured as well as the configuration system for configuring the system. An end user, such as an automobile buyer, would have difficulty using these systems.

To use these systems, a user must be trained to understand the configuration language. Thus, a user who otherwise has knowledge of the systems that are being configured must undergo training to be able to use these configuration systems to configure systems. This leads to increased expenditures for training.

Some systems are intended for configuring systems where there are a relatively small number of possible configurations and where the interdependencies between component attributes are not complicated. Some types of systems, for example, apparatus used in an industrial plant, may be built on a custom or semi-custom basis. Since particular configurations of custom or semi-custom systems may never have been built before or may be produced very infrequently, it may not be possible for users to have experience with such systems. Thus, a technique is needed to allow appropriate custom or semi-custom systems to be configured by users who may have no experience with such systems.

The specifications for some types of systems, such as certain types of industrial apparatus, may have a large number of parameters to be specified when ordering the system or its components. Since each parameter may have numerous possible values, very large numbers of possible combinations of various attribute values may exist. However, not all possible combinations define valid system configurations. For example, the selection of certain values for certain parameters may prevent the choice of certain values for other parameters.

If there are many interdependencies between parameters, such that they limit the number of valid values for one parameter based on values chosen for other parameters, the number of valid combinations may be very small compared to the total number of possible combinations (valid plus invalid). If the range of possible combinations is considered to be a data range, those combinations in the data range that are valid may be referred to as a data set. If the data set is small relative to the data range, the data set is said to be sparse, as the data range is sparsely populated with valid data.

Traditional configuration techniques are generally inefficient for configuring systems in environments with sparse data sets. Any time or effort expended toward configuring invalid combinations is wasted and leads to inefficiency. Thus, a technique is needed for accurately configuring systems using sparse data sets.

The representation used by the method according to one embodiment of the present invention can be used to represent an arbitrary constraint network. Since solving arbitrary constraint networks is NP complete, it can be concluded that the problem addressed by the invention is NP complete. An NP complete problem is difficult because the number of possible solutions expands exponentially with respect to the number of variables to be solved. Such problems can be solved by examining all of the possible solutions if the number of variables is very small. However, as the number of variables and their possible values increases, a so-called combinatorial explosion occurs and the difficulty of solving the problem rapidly exceeds the total computational power available.

To successfully configure products and assemblies in realtime, a technique is needed to not only find a solution to the problem, but to do so rapidly. Thus, an exact solution to the problem of filtering values during configuration is not expected to be possible. Consequently, the present invention applies a heuristic approach to the problem, and the heuristic is optimized to increase its efficiency as directed toward the problem.

A heuristic is a technique that improves the efficiency of a search process, possibly by sacrificing claims of completeness. In this discussion, "complete" means that everything that is identified as being selectable is actually selectable. While heuristics may not always find the ideal solution to a problem, they provide practically useful solutions and increase the efficiency of finding such solutions. A heuristic approach is very useful for configuring products and assemblies, since a customer would be unwilling to wait an exponentially long time to be sure they are ordering the optimum product for their needs. Rather, a customer would prefer a quick solution that will meet its specifications. Since there is no guarantee that waiting an exponentially long time would yield a solution that is actually better than a quick solution provided by a heuristic, the long delay associated with calculating an exact solution cannot be justified.

SUMMARY OF THE INVENTION

The invention provides a method and apparatus for selecting desired attributes for system configuration. The present invention allows efficient attribute selection even in environments with sparse data sets.

The invention avoids the problems associated with techniques based on a modeling language. The invention allows specification of relationships between attributes using data stored in a database. Data maintenance is greatly simplified since a data maintainer can alter data in the database without having to learn specialized programming techniques.

The invention uses one or more rule sets to define rules that are met when a configuration is valid. A rule set may specify the interrelation of attribute values within a product or between two or more products. A rule set that refers to attribute values of more than one product is referred to as an interproduct rule set.

First, rule sets relating to a single product are described. If the combination of attribute values that specify a product conform to at least one rule in each of the rule sets that apply to that product, that combination of attribute values is considered to specify a valid product.

Second, rule sets relating to an assembly of two or more products are described. If the combination of attribute values that specify all of the products of an assembly conform to at least one rule in each of the rule sets that apply to that assembly, that combination of attribute values is considered to specify a valid assembly.

BRIEF DESCRIPTION OF THE DRAWINGS

FIGS. 3–12 show a graphical user interface (GUI) window to illustrate the association of rule sets with product lines in the invention.

FIGS. 14–19 are rule sets of attributes of the present invention.

DETAILED DESCRIPTION OF THE INVENTION

A method and apparatus for the selection of values for attributes to specify products is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

Figure 1:
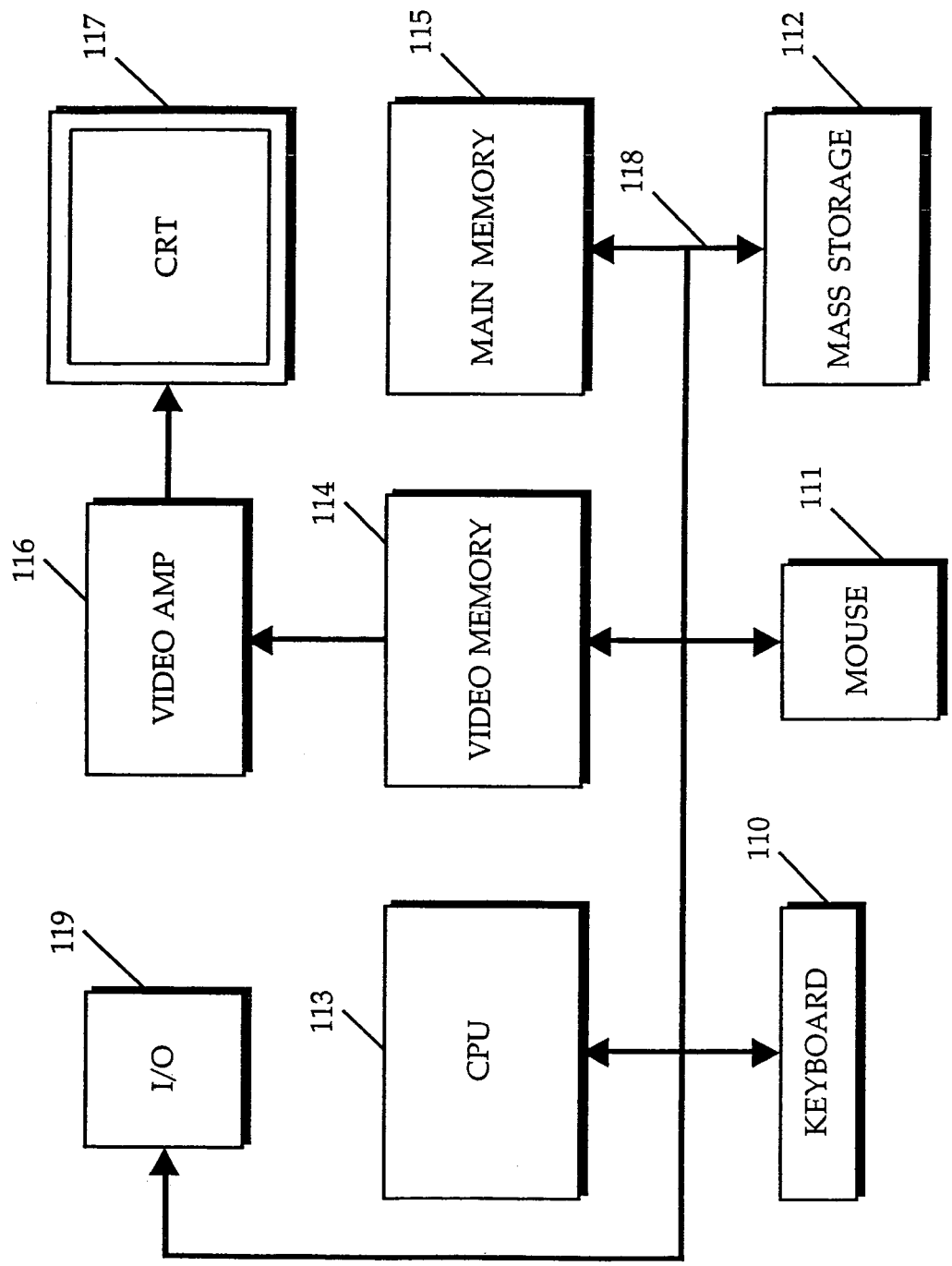
FIG. 1 provides an illustration of a computer system that can be used with the invention according to an embodiment of the invention.

The present invention can be implemented on a general purpose computer such as illustrated in FIG. 1. A keyboard 110 and mouse 111 are coupled to a bi-directional system bus 118. The keyboard and mouse are for introducing user input to the computer system and communicating that user input to CPU 113. The computer system of FIG. 1 also includes a video memory 114, main memory 115 and mass storage 112, all coupled to bi-directional system bus 118 along with keyboard 110, mouse 111 and CPU 113. The mass storage 112 may include both fixed and removable media, such as magnetic, optical or magnetic optical storage systems or any other available mass storage technology. Bus 118 may contain, for example, 32 address lines for addressing video memory 114 or main memory 115. The system bus 118 also includes, for example, a 32-bit DATA bus for transferring DATA between and among the components, such as CPU 113, main memory 115, video memory 114 and mass storage 112. Alternatively, multiplex DATA/address lines may be used instead of separate DATA and address lines.

In the preferred embodiment of this invention, the CPU 113 is a 32-bit microprocessor manufactured by Motorola, such as the 680×0 processor or a microprocessor manufactured by Intel, such as the 80×86, or Pentium processor. However, any other suitable microprocessor- or microcomputer may be utilized. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT) raster monitor 117. Video amplifier 116 is well known in the art and may be implemented by any suitable means. This circuitry converts pixel DATA stored in video memory 114 to a raster signal suitable for use by monitor 117. Monitor 117 is a type of monitor suitable for displaying graphic images.

The computer system described above is for purposes of example only. The present invention may be implemented in any type of computer system or programming or processing environment.

Products, Attributes, and Assemblies

One example of a type of product for which there are many different possible configurations that are ordered on a custom or semi-custom basis is valves for use in industrial plants. Typically, an engineer at an industrial plant will meet with sales personnel from a valve company. The engineer would usually like to order a complete valve assembly. Such an assembly includes a number of individual products that are connected together so as to operate as a unit.

For example, a valve assembly might comprise a valve body connected to an actuator, an actuator connected to a positioner, a positioner connected to a transducer, a transducer connected to the actuator, a first air set connected to the transducer, and a second air set connected to the positioner. These individual parts that comprise the assembly are referred to as products. Each product selected to be used in an assembly is selected from its product line. For example, the particular model of valve body used in the assembly is selected from the valve body product line that includes all of the different models of valve bodies that are available.

Note that an assembly may include products from different product lines, for example, a valve body and an actuator. An assembly may also include multiple parts from a single product line, for example, a first air set and a second air set, which both come from the air set product line.

Products in a product line may be differentiated from one another by the different combinations of values they have for various attributes of the products. For example, one valve body may be different from another valve body because the first has cast iron as its body material, while the second has a stainless steel alloy as its body material. Thus, the two valve bodies differ because an attribute (body material) has different values (cast iron and stainless steel alloy) between the two valve bodies. Since many attributes can usually be specified for a product, two products within the same product line may differ in the values of many attributes.

As used herein, an assembly is a collection of products that forms a complete, operational unit that is sold to the customer. A product base is a hierarchy of product lines that represents all the product lines used in an assembly. A product line is a collection of attributes, attribute values, rule sets, and rules that define all the relations within one product. A product is an instance of product line that represents a physical piece in an assembly.

Note that since a product is an instance of a product line, two different products from the same product line can be included in an assembly. Within an assembly, the products may be designated to have parent-child relations. Such parent-child designations are useful for allowing multiple products from the same product line to be included in the same assembly. For example, if two air sets are included in the same assembly, the first air set may be defined to be a parent of the second air set. Parent-child designations can be extended to form a chain, allowing more than two products from the same product line to be included in an assembly without interfering with one another during the configuration process.

Rules

While many different attribute values may be selected for the attributes of a given product, not all combinations of attribute values necessarily result in a valid product configuration. For example, a cast iron valve body may be inappropriate for a valve designed for high pressure applications, such as those requiring a Class 2500 rated valve. Thus, the invention uses rules to prevent invalid combinations of attribute values from being selected for a product.

A rule is a set of attribute values that represent a valid combination. A rule set is a collection of rules which all contain attribute values from the same set of attributes. For example, if there are attributes A, B, C, and D, one rule set might have rules that only contain values from attributes A and B, and another rule set might only contain rules with values from B, C, and D.

While many product lines each having products that possess different values for their attributes may exist, some combinations of different products do not form a valid configuration for an assembly. For example, an actuator that provides inadequate travel may be inappropriate for a particular valve body, since it might not be able to fully open and close the valve. An interproduct rule set is a rule set which references attributes from multiple products in the same assembly. An interproduct rule set is useful to prevent combination of incompatible products into an invalid assembly.

The Method

The invention provides a method for selecting attribute values to allow specification of appropriate configurations. This method is useful for specifying items, such as products and assemblies, that have several attributes, where each attribute may have several possible values. Thus, a customer may know what conditions must be satisfied for a product or assembly to be appropriate for the use intended by the customer. A salesperson may know the product lines offered, but may not have a precise understanding of all selectable attribute values and their interrelations with other selectable attribute values. This method provides a rapid process for determining a suitable configuration and verifying its validity.

The most important attribute of the configuration method is speed. The method has to be able to produce responses to a user in an acceptable amount of time. For selections of the type the method is expected to perform, sub-second response time is preferably expected.

The heuristic used to solve this problem has three characteristics. First, it is very fast. Therefore, tradeoffs for completeness versus speed are preferably made so as to maximize speed unless such decisions would cause the system to become unusable for lack of completeness. Second, the heuristic should be sound. That is, it should not eliminate any choices that could actually be valid. If a salesperson is taking an order and knows that a combination is available, but the system does not let the salesperson make the desired choice, the customer may become frustrated and not place an order for that combination. On the other hand, the salesperson should not be able to sell an assembly that cannot be built. Therefore, the third characteristic is that by the time all of the selections have been made, the method should be able to tell whether or not the selected values form a valid assembly.

The heuristic according to one embodiment of the invention distinguishes between local and global configuration. At the local level, that is, at the rule set level, computations are exact. The method recognizes exactly which values form a valid combination. At the global level, between rules sets, the method is not precise. For example, if RuleSet1 specifies that attributes a1 and b1 make a valid combination and RuleSet2 specifies that attributes a1, b1, and c1 make a valid combination, the method does not recognize that the pairing in RuleSet2 of attributes a1 and b1 is dependent on the pairing that occurred in RuleSet1.

The following pseudocode describes how the method of one embodiment of the invention works:

Create a working set that contains all the attribute selections made. The working set represents the set of selectable attribute values. Attribute values in the working set are indexed by attribute. An attribute value is valid if it is in the working set. If there are no values for an attribute in the working set, then all values of that attribute are considered to be valid.

---

Set the removal flag to the value true.
While the removal flag is value true.
    Set removal flag to value false.
    For all attributes A in the working set.
        For all rule sets RS, which reference A and have not been visited on this pass of the working set.
            For all bindings of rule set RS. (This step is important for interproduct rule sets where aliases of columns are bound to products in the assembly.)
                Unmark all values in the assembly.
                For all valid values V of attribute A.
                      For all rules R which reference V.
                          If all Values in R are valid, then mark all the values in R.
                    End for all R.
                End for all V.
                For all attributes ARS referenced in the rule set RS.
                    For all the values VRS of attribute ARS.
                        If VRS is in the working set, and not marked, then remove it and set removal flag to value true.
                        If VRS is not in the working set and is marked, then add it to the working set.
                    End for all VRS.

-continued

```
            End for all ARS.
            End for all bindings.
        End for all RS.
    End for all A.
End while.
```

Note that as this method proceeds from rule set to rule set, information about the combination that caused the value to be marked in the first place is lost, so global configuration is not performed. Also note that if values have been chosen for all the attributes, then the algorithm will remove values if no rules in a rule set contain the available valid values. Thus, it is possible to check if an entire product is valid by selecting values for all the attributes, performing the method, and checking for values that were selected, but now are removed. In the same way, if a user makes a selection that is not really supposed to be selectable, then the method will remove the selected value from the working set and the user interface can notify the user that the choice made is actually not a valid option.

EXAMPLE #1

To show how one embodiment of the present invention works, a simple example is instructive. (In this description, attributes are identified by capital letters and their respective values are represented by the enumerated instances of the lower case representation of the attribute, e.g. a1 and a2 are attribute values of attribute A). In one product line, attributes A, B, C, D, E, and F are specified. These attributes have attribute values a1–a5 for attribute A, b1–b3 for attribute B, c1–c4 for attribute C, d1–d3 for attribute D, e1–e5 for attribute E, f1–f4 for attribute F, and g1–g3 for attribute G.

FIGS. 14–17 illustrate rule sets for the attributes A, B, C, D, E, F, and G. Each rule set lists valid combinations of attribute values for the attributes of the rule set. For example, the rule set of FIG. 14 lists seven valid combinations (the rows) of attribute values for the attributes A and B. FIG. 15 is a rule set including eight valid combinations of attribute values for the attributes B, C, and E. (Note that the one or more attributes can be contained in more than one rule set). FIG. 16 is a rule set for the attributes C and D, with seven valid combinations of attribute values. Six valid combinations of attribute values are shown in the rule set of FIG. 17 for attributes F and G.

In this example, there is no single rule set for all attributes A, B, C, D, E, F, and G. However, by selecting attribute values for attributes A, C, and F, it is possible to show a relationship among all attributes. Consider where a user selects attribute values a1, c4, and f3. Referring first to the rule set of FIG. 14, all combinations that do not contain attribute value a1 are eliminated, leaving two valid combinations, a1 and b1, and a1 and b2. Referring to the rule set of FIG. 15, all combinations that contain attribute value b3 are eliminated because there is no combination in the rule set of FIG. 14 that includes both a1 and b3. Reviewing the rule set of FIG. 15 for the attribute value c4 shows only one remaining combination that is valid, namely b2, c4, and e5. Because there is only one combination in the rule set of FIG. 14 that has both a1 and b2, the previously valid combination of a1 and b1 is now eliminated. Proceeding to the rule set of FIG. 16, there are two combinations that contain attribute value c4. All others are invalid. In the rule set of FIG. 17, only one combination contains attribute value f3. Thus the selection of attribute values a1, c4, and f3 yields only two valid combinations from the rule sets of FIGS. 14–17, namely a1, b2, c4, e4, d1, f3, g2; and a1, b2, c4, e4, d2, f3, g2. By building smaller rule sets with fewer attributes, complex relationships can be discovered among multiple attributes.

Interproduct Rule Sets

The above example only defines relations between attribute values in a single production an assembly. Relations between attributes values in different products can also be defined. To define such rule sets, each column in the rule set is given a column alias which is another way to reference the product associated with the column with the alias.

When an embodiment of the invention is evaluating interproduct rules, it evaluates a series of bindings for the columns in the rule set. Each binding assigns a product to a column. The product is assigned when the configuration engine looks for valid attribute values while it is filtering. Note that two or more products from the same product line may be present in a configuration, so the binding allows the invention to compute valid and invalid values on a product by product basis. For a binding to be valid, it obeys the following rules:

The product line of a product bound to an alias must match the product line of the alias.

If two columns share the same alias, they are bound to the same product.

If two columns have different aliases, they are bound to different products.

All constraints specified on the rule set are to be satisfied.

Note that because of these rules it is entirely possible that an interproduct rule set will not be considered in an assembly. All interproduct rule sets are preferably defined on the product line "Global-Product-Line."

Product Line Hierarchies

As mentioned earlier, product lines can be hierarchical. This means that the modeler can define a tree of product lines in which rule sets and attributes are inherited down the tree. If a product line B is derived from product line A, then, when configuring a product from product line B, the rule sets defined on B, as well as those defined on A, will be used.

EXAMPLE #2

An example of why the method is a heuristic is instructive. FIGS. 18 and 19 illustrate rule sets for four attributes identified as attributes A, B, C, and D. FIG. 18 illustrates a rule set for the attributes A, B, and C. FIG. 19 represents a rule set for the attributes B, C, and D. There may be some relationships between all four attributes A, B, C, and D. These relationships will be revealed by application of the heuristic. It is sometimes easier or more natural to create rule sets for subsets of attributes than for larger groups of attributes.

In the case of FIG. 18, there are three valid combinations (the three rows of the rule set) of attribute values for the attributes A, B, and C. Similarly, there are three valid combinations of attribute values for the attributes B, C, and D in FIG. 19.

As noted above in the example, a user selects certain attribute values. After the user selects values, a "working set" is created and populated. If the user selects a1 from attribute A, the method places attribute values b1, b2, b3, c1, c2, and c3 in the working set. Then, when the algorithm is evaluating the second rule set, b1 and c1 are both valid, so d1 is added to the working set. Likewise, b2 and c2 are valid, so d2 is added and b3 and c3 are valid, so d3 is added. Note that, in reality, only d3 is selectable because in the first rule set, the combinations b1–c1 and b2–c2 were not allowed. Thus, when the user selects d1 after selecting a1, the values b1 and c1 are placed in the working set. However, when evaluating the first rule set, the method finds no rules specifying that b1 and c1 form a valid combination. This causes the values a1, b1, and c1 to be removed from the working set. Then, on the second pass, d1 is removed from the working set because there are no valid values for B or C. This leaves us with no values in the working set, which means the configuration is invalid. In this way, the heuristic may gave wrong results initially, but corrects itself by the time the user has selected values for all the attributes.

Database Tables

All the data associated with a configuration model are preferably stored in a database. Below, examples of database tables used for that purpose are defined:

Attributes
  AttributeId (long)—Unique identifier for the attribute referenced on this row. This should be unique for all attributes in the database.
  AttributeName (string)—Name of the attribute. These should be unique within a product line.
  ProductLineId (long)—Reference to the product line that contains this attribute.

AttrValues
  AttrValueId (long)—Unique identifier for the attribute value on this row. This should be unique for all attribute values in the database.
  AttrValueName (string)—Name of the attribute value. This should be unique within an attribute.
  AttributeId (long)—Reference to the attribute that can be assigned this value.

ProductBases
  ProductBaseId (long)—Unique identifier for the product base on this row. This value should be unique for all product bases in the database.
  ProductBaseName (string)—Name assigned to the product base. This value should be unique for all product bases in the database.

ProductLines
  ProductLineId (long)—Unique identifier for the product line on this row. This value should be unique for all product lines in the database. The value 0 is not a valid product line id.
  ProductLineName (string)—Name assigned to the product line. This value should be unique for all product lines in a product base.
  ParentId (long)—Product lines form a hierarchical tree structure. This column is a reference to this product line's parent. If this product line has no parent, enter 0 for the parentId. In this embodiment, preferably only the product line Global-Product-Line can have a parent of 0. Other product lines preferably all have values other than 0.
  ProductBaseId (long)—Reference to the product base that contains this product line.

Rules
  RuleId (long)—Unique identifier for the rule on this row. This value should be unique for all rules in the database.
  RuleSetId (long)—Reference to the rule set that contains this rule.
  AttrValueIdList (string)—This is list of AttrValueId's which specifies the attribute values in this rule. The AttrValueId's are preferably separated by separators, such as colons or some other recognizable delimiter. Ever id is followed-by-the-separator, including the last one. For example, if a rule needs to reference AttrValueId's 1, 2, and 3, the string in this column would be "1:2:3:" if colons are used as the separator.

RuleSets
  RuleSetId (long)—Unique identifier for the rule set on this row. This value should be unique for all rule sets in the database.
  RuleSetName (string)—Name used to reference this rule set for debugging and maintenance purposes. This value should be unique for all rule sets in a product line.
  ColumnList (string)—This is a list to specify the attributes and aliases for a column. The elements in the list are preferably separated by a separator, such as a colon or some other recognizable delimiter. The format is preferably as follows:
    AttributeId1[,ProductBaseId1,AliasName1]:AttributeId2[,ProductBas eId2,AliasName2]: . . .
    Note that this format is similar to the one for the AttrValueIdList except it contains the additional information of ProductBaseId and AliasName. If a rule set exists that is only defining relations between attributes of the same product and it is desired to reference the AttributeId's 1, 2, and 3, then the string would be "1:2:3:" if colons are used as separators. If this is an interproduct rule set where it is desired to reference attributes 1, 2, and 3 in product lines 11, 22, and 33, and use of alias names alias1, alias2, and alias3 is desired, then the string would be "1,11,alias1:2,22,alias2:3,33;alias3:".
  Constraint (string)—This is a string that represents the constraints that are true for this rule set to be evaluated. The supposed keywords are "parent," "AND," "==," and "!=," although other keywords may be used. Using these tokens and alias names, a constraint such as "parent(alias1)==alias2 AND parent(alias2)==alias3" may be constructed. The grammar for a constraint is [parent(]aliasname[)]<==|!=>[parent(]aliasname[)] [AND] . . . . In this syntax, items in square brackets ([ ]) are optional and items in angled brackets (< >) are required.

USER INTERFACE EXAMPLE

The invention may be understood by reference to a more practical example, in this case, assembling a clothing outfit limited by rules controlling attribute combinations. FIGS. 3–12 show a graphical user interface (GUI) window for an Attribute Selection Engine Maintenance Tool (ASEMaint) to illustrate the association of rule sets with product lines in the invention. The GUI window of the maintenance tool comprises three frames. The first frame is located in the upper left corner of the GUI window, and provides a listing of the product lines under consideration. In this example, the product lines relate to clothing and include: a "shirt" product line, a "pant" product line, a "belt" product line, a "shoes" product line, and a "hat" product line. Each product line is listed in the window below the "Global-Product-Line" listing. The second frame of the GUI window is located adjacent to the first frame in the lower left corner of the GUI window, and provides a listing of rule sets for the product line selected in the first frame. The third frame of the GUI window is located to the right of and adjacent to the first and second frames. The third frame provides a listing of the rules associated with the rule set selected in the second frame.

Though described herein with respect to clothing, it will be obvious that the invention has similar application to any products for which associative or interdependence rule sets can be defined. Such product lines may include tangible products such as mechanical components, or intangible products such as commercial travel packages, wherein product lines might include destination, accommodation, mode of transportation, special events, etc.

Figure 3:
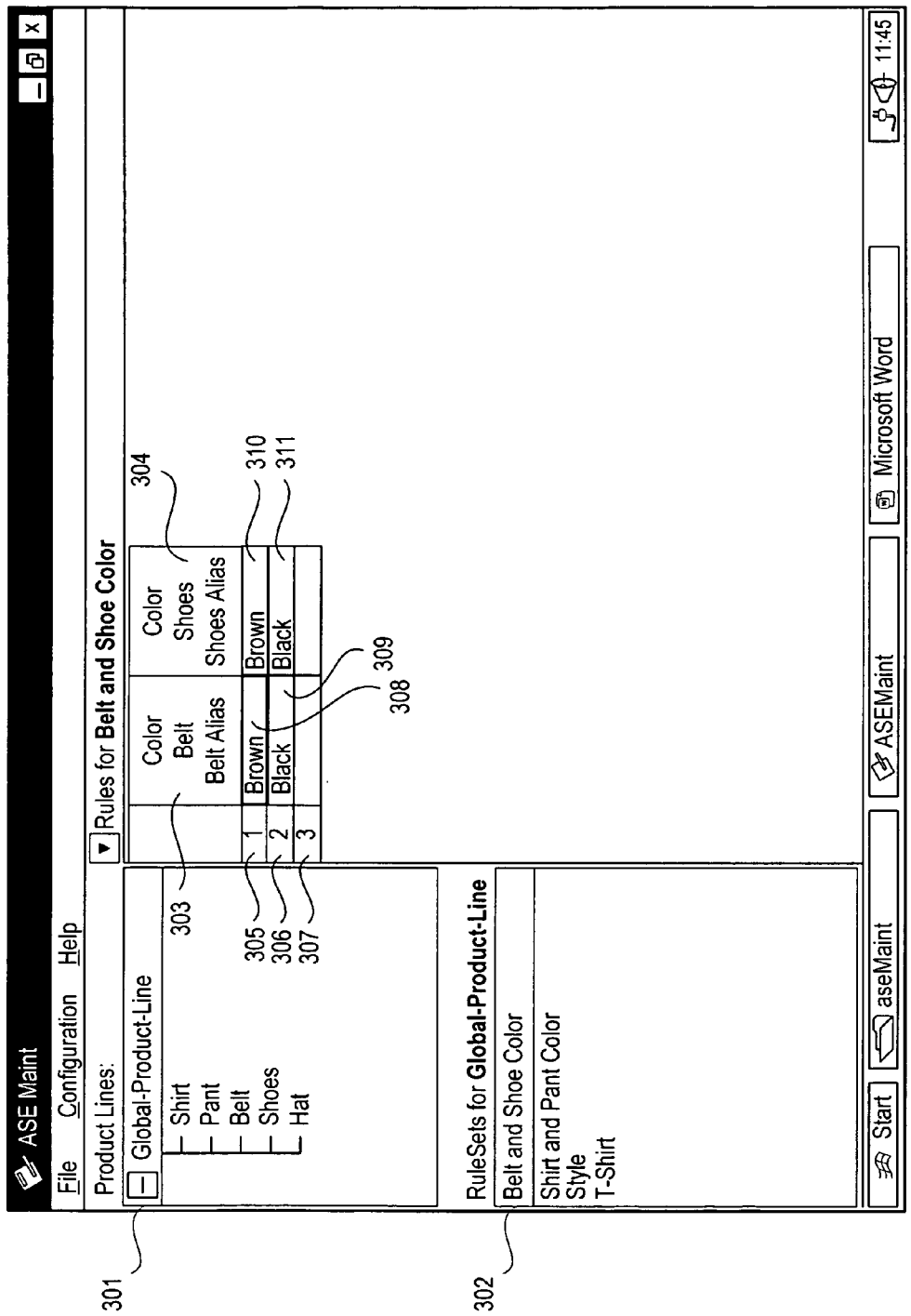

In FIG. 3, Global-Product-Line 301 is selected in the first frame, and, accordingly, the rule sets for the Global-Product-Line are listed in the second frame. Global-Product-Line 301 encompasses all of the product lines listed below it in the first frame window, i.e., the shirt product line, the pant product line, etc. Rule sets of the Global-Product-Line may be defined over attributes for one or more of the underlying product lines. Rule sets for product lines such as shirt or pant product lines are defined only over attributes of the respective product line. Thus, a hierarchy of rule sets is formed.

The rule sets for Global-Product-Line 301 shown in the second frame of FIG. 3 include "belt and shoe color", "shirt and pant color", "style", and "T-shirt". Rule set 302, belt and shoe color, is selected in FIG. 3, triggering the display of the rules for belt and shoe color attributes in the third frame of the GUI window. The rules for belt and shoe color are displayed in a row/column format, wherein each column designates a product line, a product line attribute, and a product line alias for the case where there is more than one instance of a product line (e.g., outer shirt and under shirt, discussed below). Each row designates a rule, and each entry (308–311) is an attribute value. Each rule represents a valid combination of attribute values for the current rule set.

In the example of FIG. 3, the rules for belt and shoe color comprise column 303 for belt color attribute values and column 304 for shoe color attribute values. Rows 305–307 define rules 1–3, respectively. Rule 1 consists of the combination of brown belt color attribute value 308 and brown shoe color attribute value 310. Similarly, rule 2 consists of black belt color attribute value 309 and black shoe color attribute value 311. As shown, rule 3 specifies no attribute values.

The rules consist of valid combinations of attribute values. The available attribute values for the product lines are limited to those which exist in those rules containing the designated attribute value. In the rule set shown for belt and shoe color attributes, if the brown belt color is selected, according to rule 1, the only shoe color available is brown. Similarly, if the brown shoe color is selected first, then only brown belt colors may be selected thereafter. In one embodiment of the invention, the black belt color is not shown in the attribute selection engine if it is no longer a valid selection. Rule 3 may be defined by placing appropriate attribute values in the blank columns of row 307.

Figure 4:
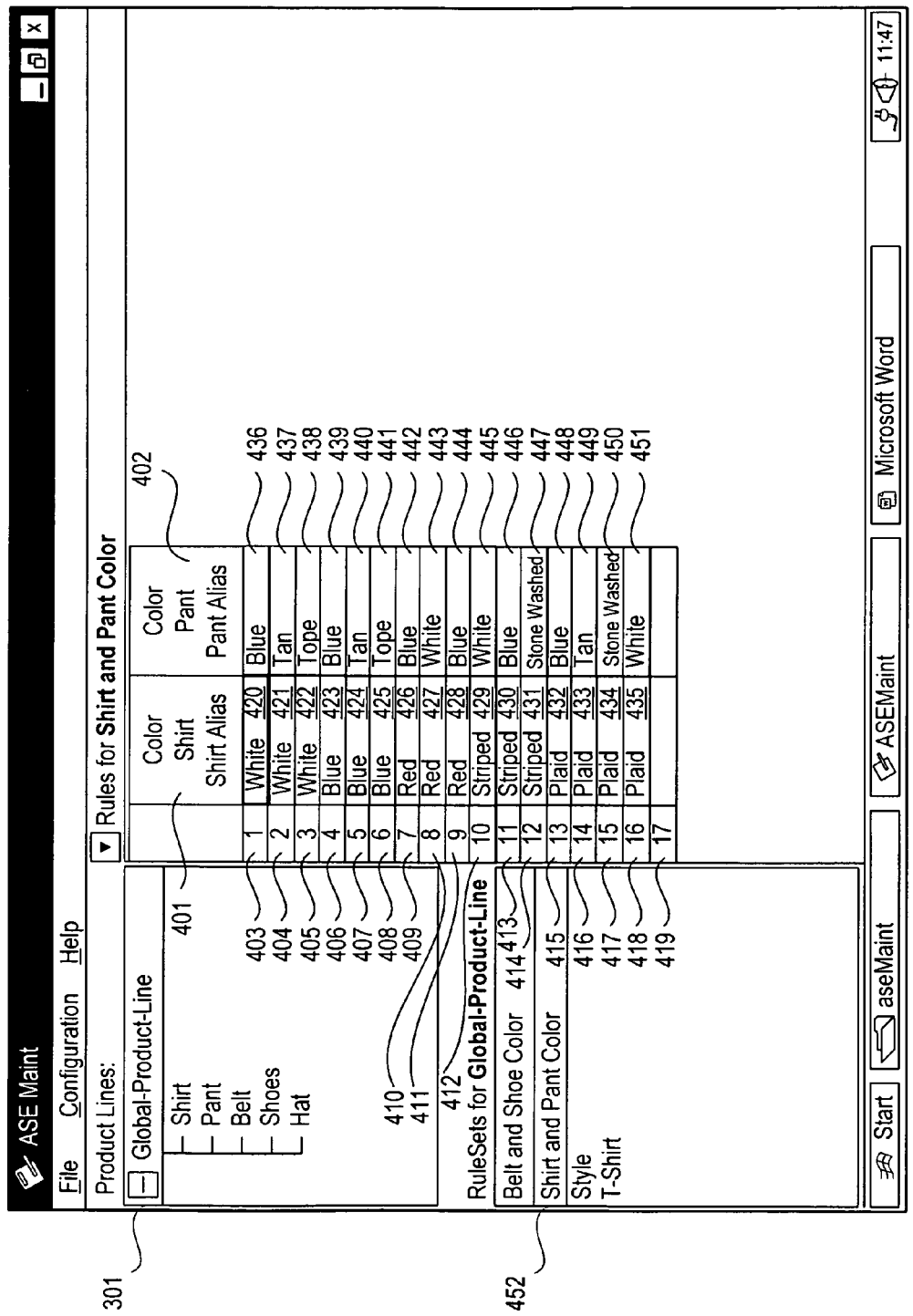

As previously stated, the rule sets for Global-Product-Line 301 may refer to one or more of the underlying product lines. In the example of FIG. 3, the rules for belt and shoe color refer to attributes of the belt and shoe product lines. In the example of FIG. 4, the selected rule set refers to attributes of the shirt and pant product lines. Global-Product-Line 301 is again selected, and in the second frame under rule sets for Global-Product-Line, shirt and pant color rule set 452 is selected.

The rules for shirt and pant color are shown in the third frame of FIG. 4 with column 401 containing attribute values for the shirt color attribute and column 402 containing attribute values for the pant color attribute. Rows 403–419 correspond to rules 1–17, respectively. Rule 17 contains no attribute value entries. Rules 1–16 are defined over five shirt color attribute values and five pant color attribute values. In column 401 containing shirt color attribute values, attribute values 420–435 are associated with rules 1–16. In column 402 containing pant color attribute values, attribute values 436–451 are associated with rules 1–16, respectively.

The defined shirt color attribute values are white, blue, red, striped and plaid. The defined pant color attribute colors are blue, tan, tope, white and stone washed. In column 401, attribute values 420–422 are white, attribute values 423–425 are blue, attribute values 426–429 are red, attribute values 430–431 are striped, and attribute values 432–435 are plaid. In column 402, attribute values 436, 439, 444, 446 and 448 are blue; attribute values 437, 440, 442 and 449 are tan; attribute values 438, 441, and 443 are tope; attribute values 445 and 451 are white; and attribute values 447 and 450 are stone washed.

If the shirt color attribute value blue is selected during attribute selection in the Attribute Selection Engine, rules 4–6 apply. According to rules 4–6 the only valid pant color attribute values are blue, tan and tope, respectively. The attribute values of stone washed and white are unavailable according to the rules for shirt and pant color attributes. Similarly, if a pant color attribute value of blue is initially selected, rules 1, 4, 9, 11 and 13 apply. According to these applicable rules, the available shirt color attribute values are white, blue, red, striped and plaid, respectively.

Figure 5:
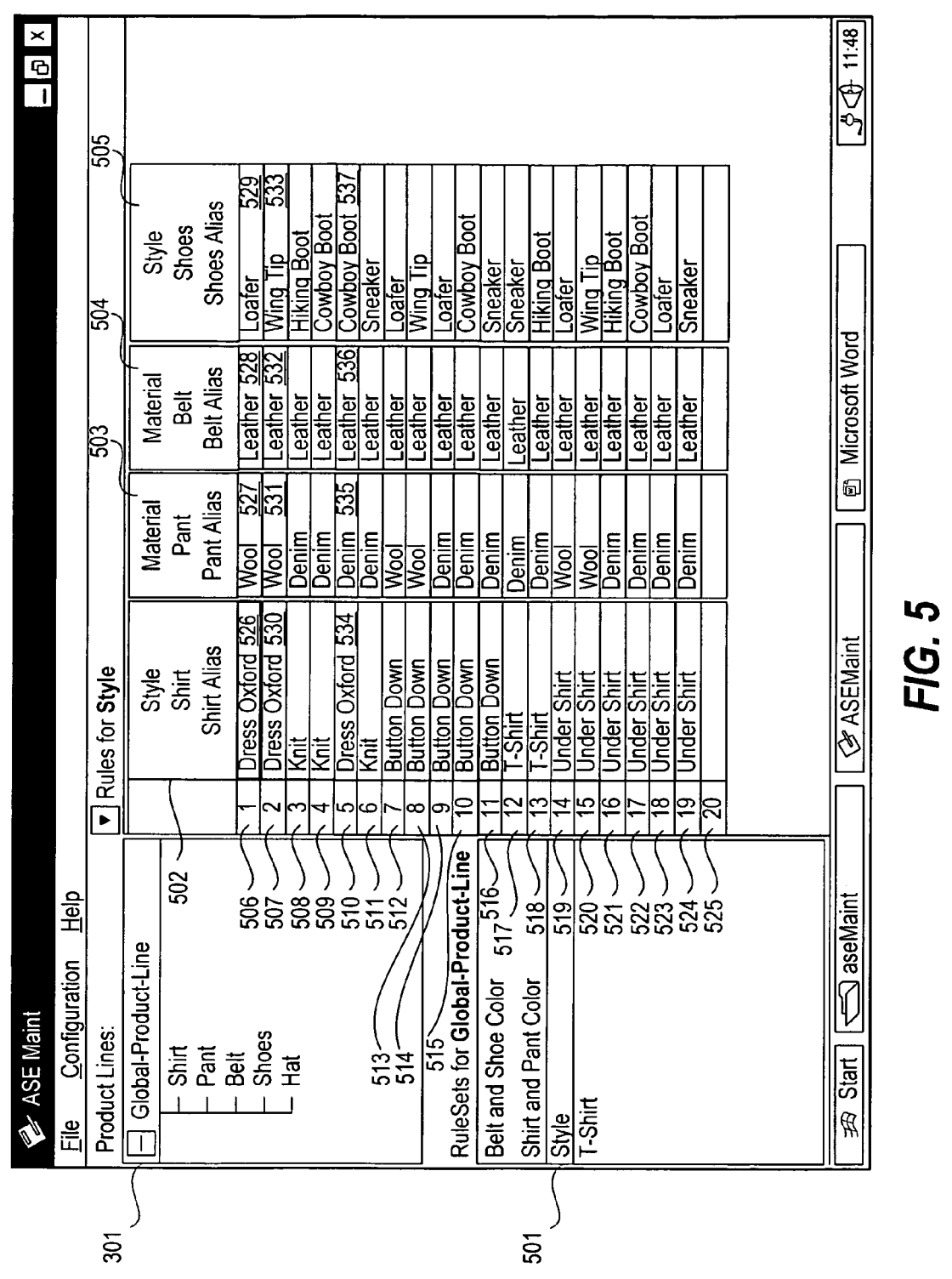

In FIG. 5, style rule set 501 is selected in the second frame and the rules for style are accordingly displayed in the third frame. As shown, the rules for style comprise four columns: shirt style column 502; pant material column 503; belt material column 504; and shoes style column 505. Rows 506–525 correspond to rules 1–20, respectively. The defined attribute values for shirt style are dress oxford, knit, button down, T-shirt and undershirt; the defined attribute values for pant material are wool and denim; the defined attribute value for belt material is leather; and the defined attribute values for shoe styles are loafer, wing tip, hiking boot, cowboy boot and sneaker.

For the purposes of example, the shirt style dress oxford is assigned to attribute values 526, 530 and 534. the pant material wool is assigned to attribute values 527 and 531, and the pant material denim is assigned attribute value 535. The belt material leather is assigned to attribute values 528, 532 and 536. The shoe style loafer is assigned to attribute value 529, the shoe style wing tip is assigned to attribute value 533, and the shoe style cowboy boot is assigned to attribute value 537. Row 506 comprises attribute values 526–529; row 507 comprises attribute values 530–533; and row 510 comprises attribute values 534–537.

According to rules 1, 2 and 5 (rows 506, 507, and 510), if the shirt style attribute value "dress oxford" is selected, the available shoe style attribute values are constrained to loafer under rule 1, wing tip under rule 2, or cowboy boot under rule 5. If a wool pant material is subsequently selected, the available shoe style attributes are further restrained to loafer or wing tip under rules 1 and 2, respectively. If the denim pant material is selected rather than the wool material, the shoe style is limited to cowboy boot under rule 5.

Figure 6:
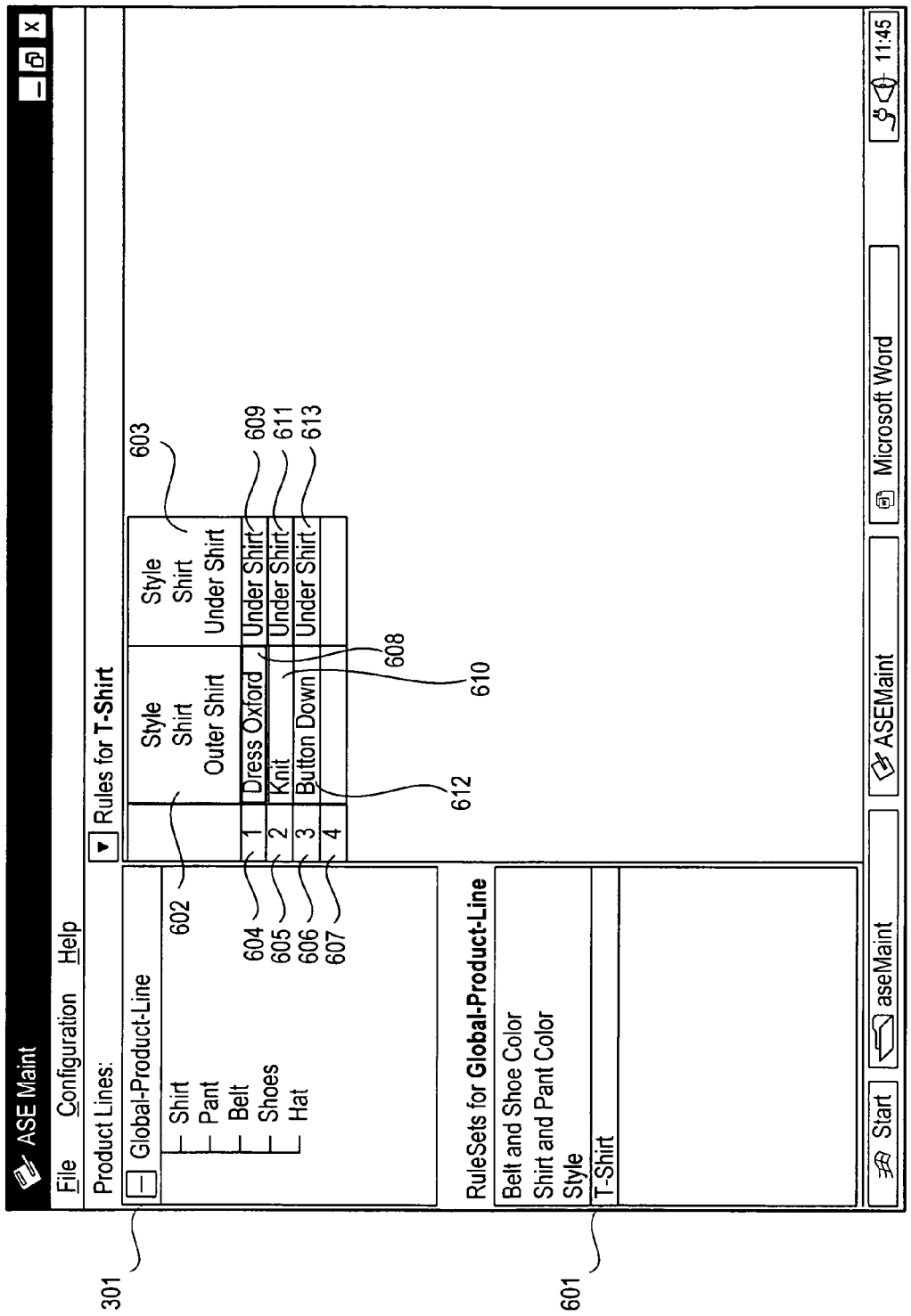

In FIG. 6, T-shirt rule set 601 is selected in the second frame of the GUI window and the rules for T-shirt are displayed in the third frame. The T-shirt rule set is defined over two instances of the shirt product line, the first instance being the outer shirt and the second instance being the under shirt. The separate instances are reflected in the corresponding product line aliases specified for columns 602 and 603 in the third frame. Rows 604–607 are associated with rules 1–4, respectively. Rule 4 and FIG. 6 has no defined attribute values. Column 602 is specified as containing the style attribute values for the shirt product line under the outer shirt alias. Attribute values 608, 610 and 612 associated with rows 604–606 of column 602, are defined as dress oxford, knit and button down respectively. Attribute values 609, 611 and 613, associated with rows 604–606 of column 603, are defined as under shirt.

According to the rules for T-shirt, the selection of the dress oxford shirt, a knit shirt, or a button down shirt as an outer shirt permits the selection of an under shirt according to rules 1–3. Similarly if an under shirt is first selected, an outer shirt of style dress oxford, knit or button down may be selected.

Figure 7:
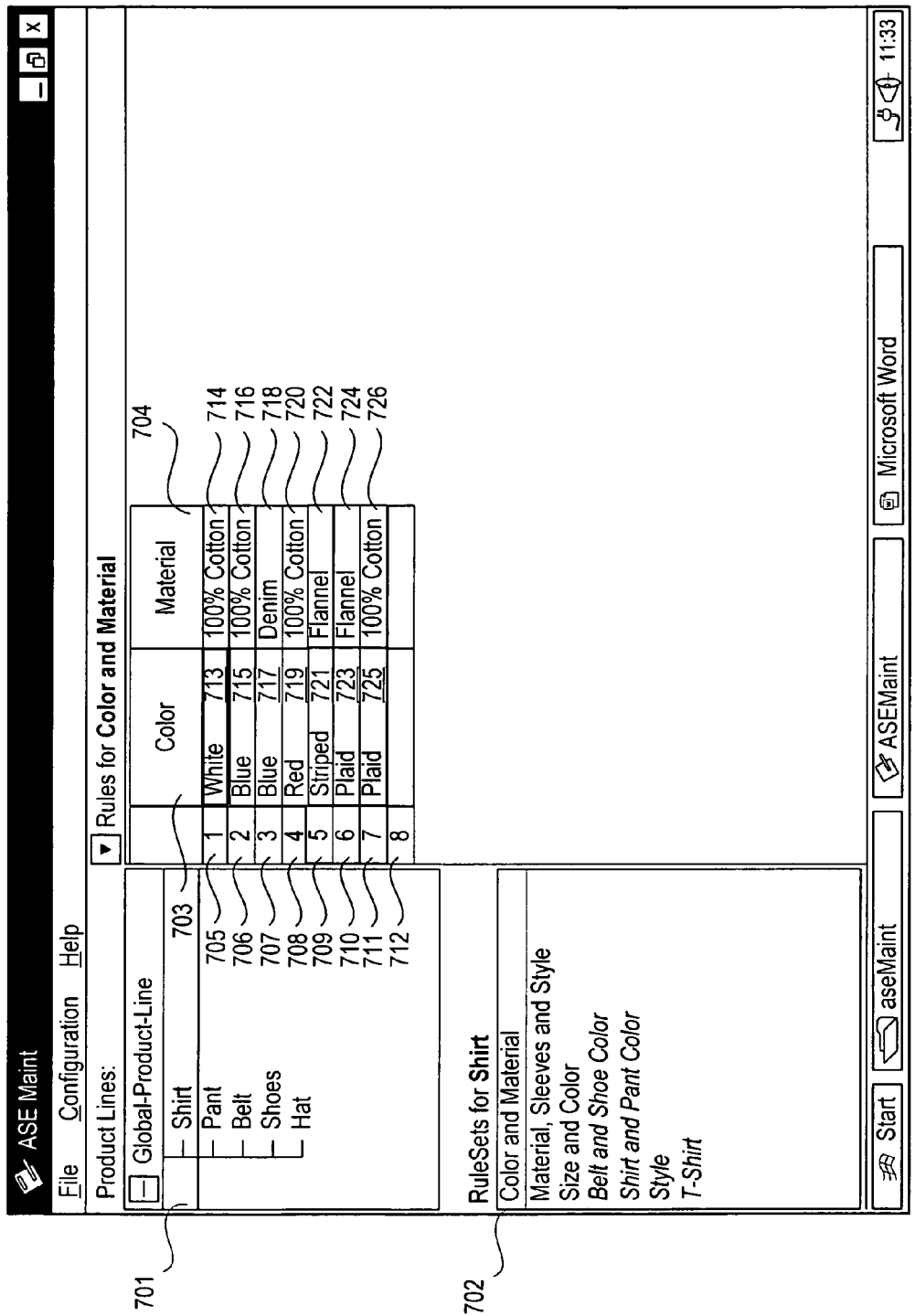
Figure 8:
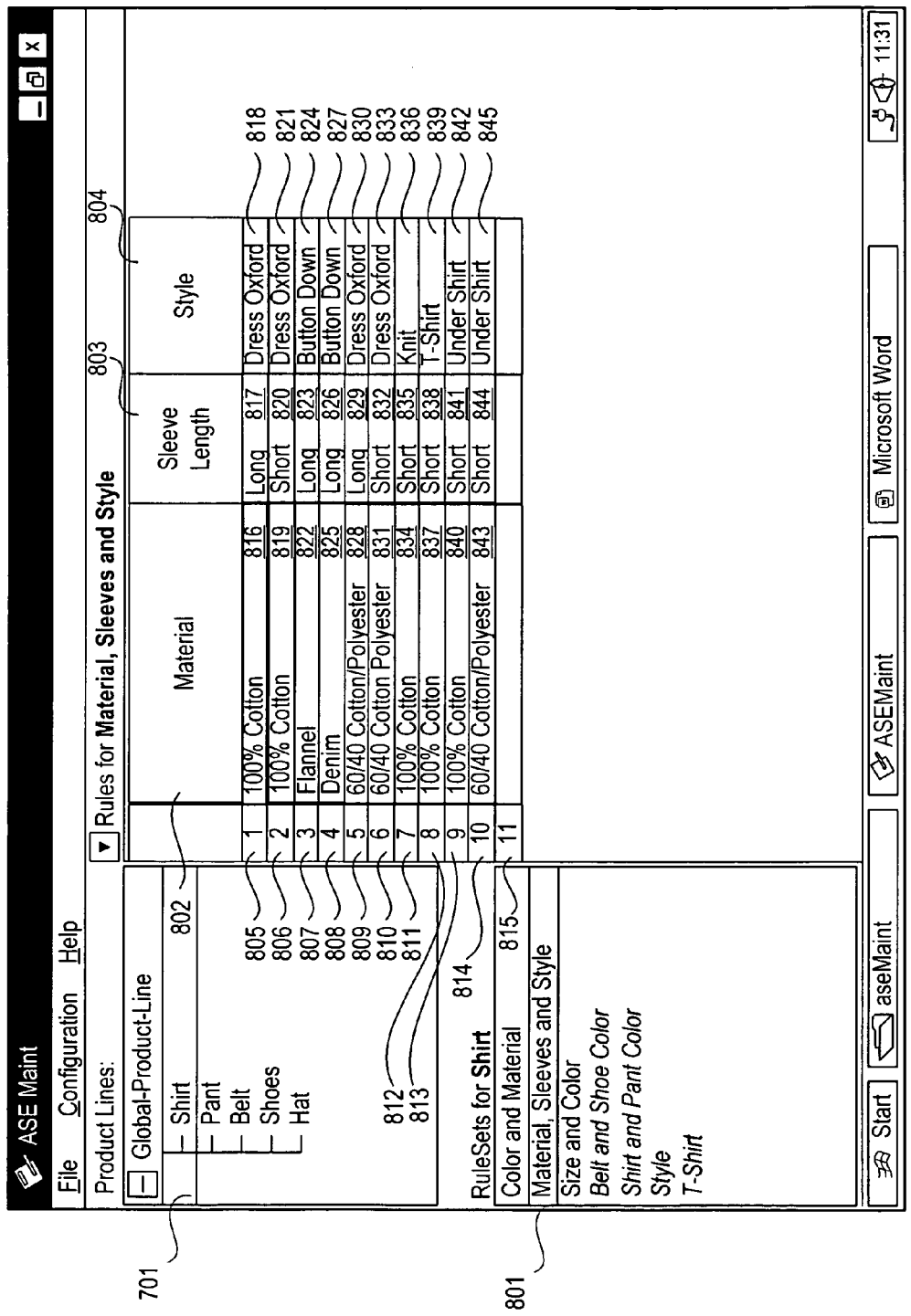
Figure 9:
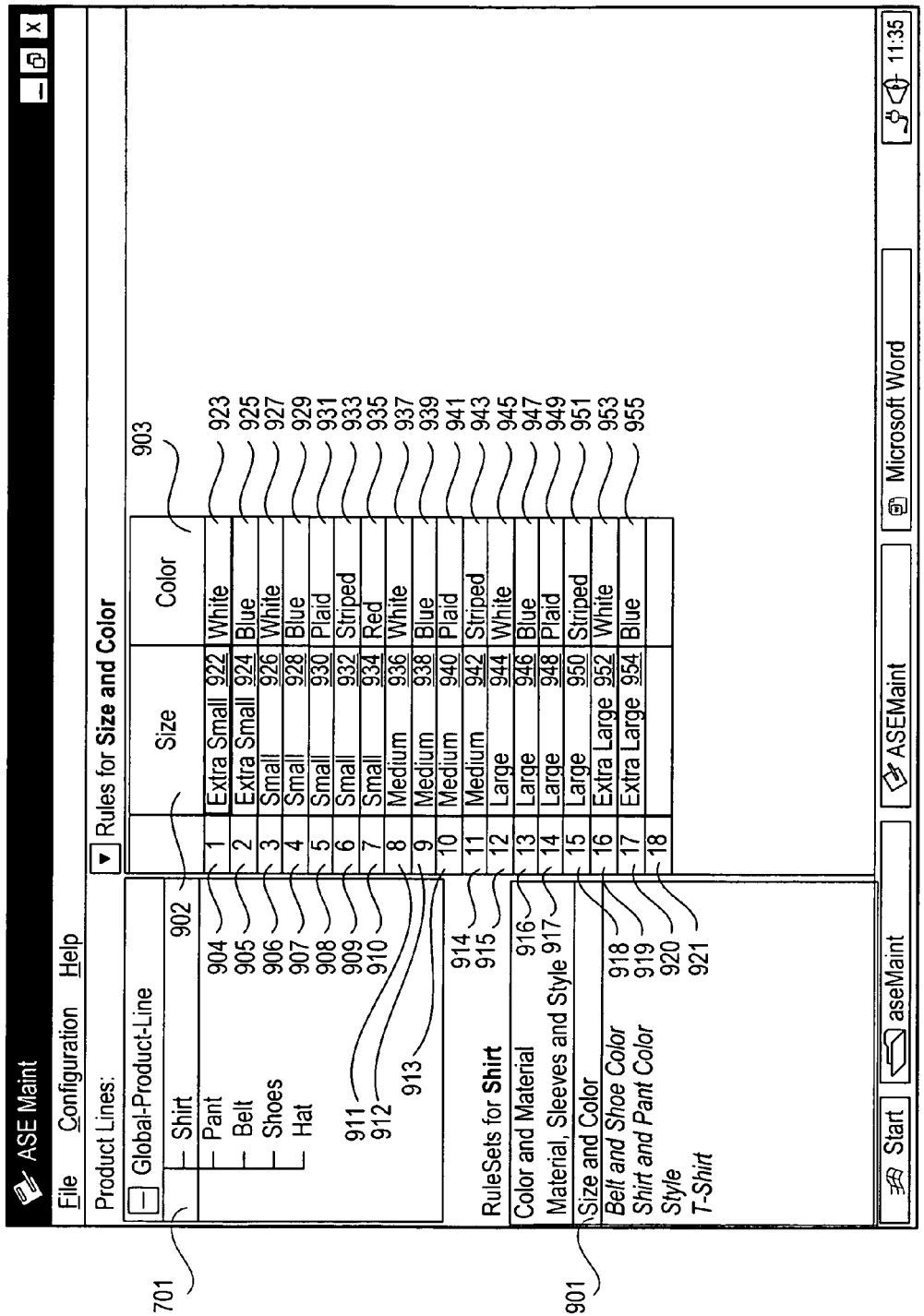
Figure 10:
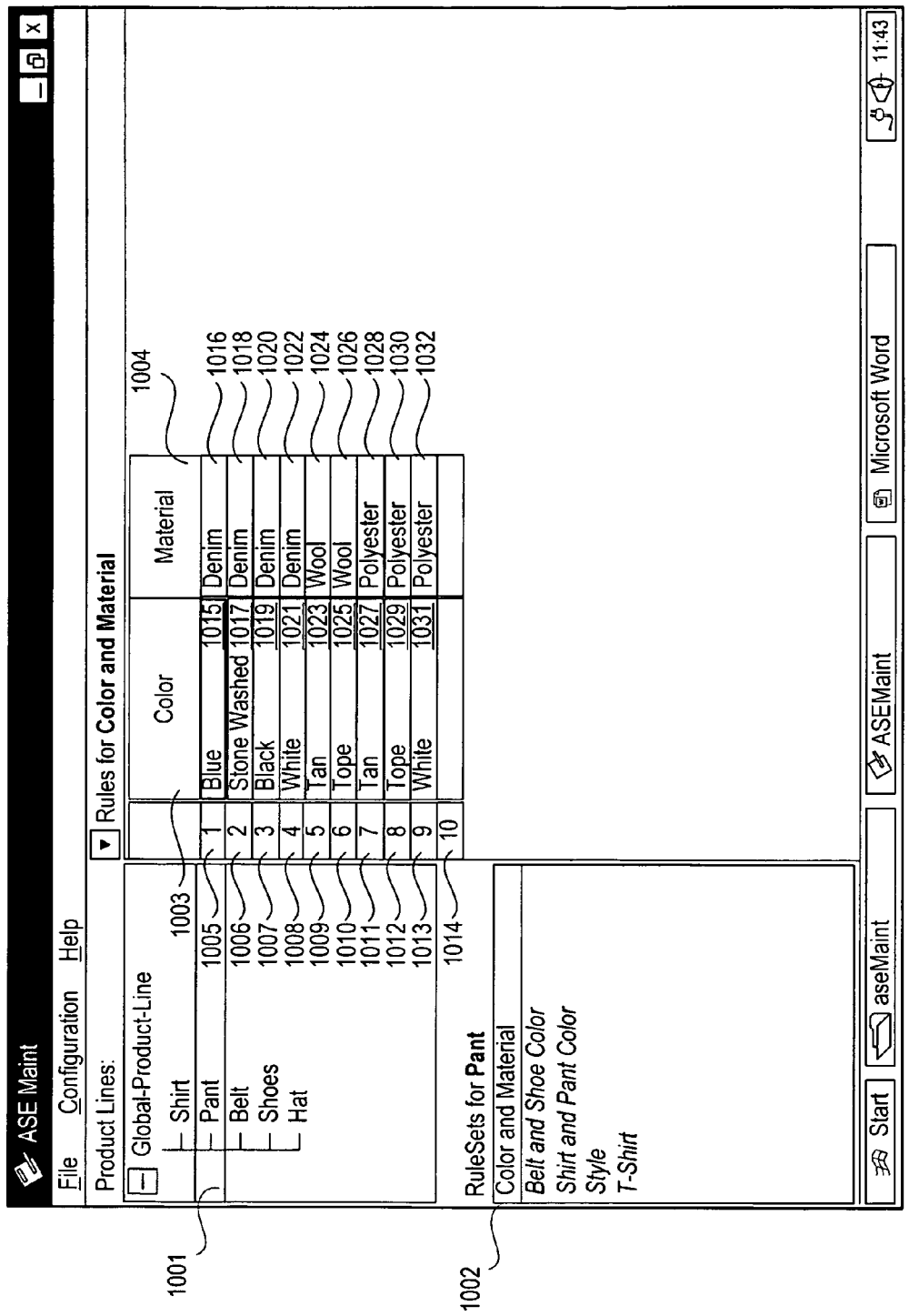

FIGS. 7–12 relate to rule sets for product lines other than the Global-Product-Lines such as the shirt product line, the pant product line, etc. FIGS. 7–9 refer to the shirt product line. FIG. 10 refers to the pant product line, FIG. 11 refers to the belt product line, and FIG. 12 refers to the shoes product line. In each Figure, the respective product line is selected in the first frame of the GUI window and the appropriate rule sets are shown in the second frame. Within the rule sets for the product lines other than the Global-Product-Lines, rule sets specific to the product line are shown in normal text style, whereas the global rule sets remain listed in the second frame in italics text style.

In FIG. 7, the shirt product line 701 is selected in the first frame of the GUI window, and the rule sets for shirt are listed in the second frame above the rule sets previously discussed for Global-Product-Line 301. The rule sets specific for the shirt product line include the color and material rules; the material, sleeves and styles rules; and the size and colors rules. In FIG. 7, the color and material rules 702 are selected.

The rules for color and material shirt attributes are displayed in the third frame of the GUI window with column 703 containing color attribute values and column 704 containing material attribute values. Rows 705–712 are associated with rules 1–8, respectively. Color attribute values 713, 715, 717, 719, 721, 723 and 725 are associated with rules 1–7, respectively. Material attribute values 714, 716, 718, 720, 722, 724 and 726 are associated with rules 1–7, respectively.

As shown, color attribute value 713 is designated as white, color attribute values 715 and 717 are designated as blue, color attribute value 719 is designated as red, color attribute value 721 is designated as striped, and color attribute values 723 and 725 are designated as plaid. Material attribute values 714, 716, 720 and 726 are designated as 100% cotton; material attribute value 718 is designated as denim; and material attribute values 722 and 724 are designated as flannel.

According to the rules for color and material, if the color blue is selected, then rules 2 and 3 apply, limiting the material available to either 100% cotton or denim, respectively. Likewise, if flannel material is first selected, then according to rules 5 and 6, respectively, the striped color or the plaid color may be selected.

In FIG. 8, material, sleeve and style rules 801 are selected in the second frame of the GUI window, and the rules are displayed in the third frame. In the rules for material, sleeve and style, column 802 contains material attribute values 816, 819, 822, 825, 828, 831, 834, 837, 840 and 843 associated with rules 1–10, respectively. Column 803 contains sleeve length attribute values 817, 820, 823, 826, 829, 832, 835, 838, 841 and 844 associated: with rules 1–10, respectively. Column 804 contains style attribute values 818, 821, 824, 827, 830, 833, 836, 839, 842 and 845 associated with rules 1–10, respectively. Rows 805–815 correspond to rules 1–11, respectively. Rule 11 contains no specified attribute values.

There are four designated material attribute values in the rules: 100% cotton assigned to attribute values 816, 819, 834, 837, and 840; flannel assigned to attribute value 822; denim assigned to attribute value 825; and 60/40 cotton/polyester assigned to attribute values 828, 831 and 843. Two sleeve length attribute values are specified: "long" sleeve length assigned to attribute values 817, 823, 826 and 829; and "short" sleeve length assigned to attribute values 820, 832, 835, 838, 841 and 844. Five shirt styles are specified in the rules: dress oxford assigned to attribute values 818, 821, 820 and 833; button down assigned to attribute values 824 and 827; knit assigned to attribute value 836; T-shirt assigned to attribute value 839; and under shirt assigned to attribute values 842 and 845.

According to the rules of FIG. 8, if 100% cotton is selected as the shirt material, then rules 1, 2 and 7–9 apply. Under these rules, the available shirt styles and sleeve lengths are limited to dress oxford style shirts of long and short sleeve length, and knit shirts, T-shirts and under shirts of short sleeve length. Similarly, if shirt style is selected first and dress oxford is indicated, rules 1, 2, 4 and 5 apply. Under these rules, dress oxford shirts of long and short sleeve length are available in 100% cotton material and 60/40 cotton/polyester material.

In FIG. 9, the size and color rules 901 are selected in the second frame of the GUI in window and the rules for sizing color for the shirt product line are displayed in the third frame. Column 902 contains size attribute values 922, 924, 926, 928, 930, 932, 934, 936, 938, 940, 942, 944, 946, 948, 950, 952 and 954 associated with rules 1–17, respectively. Column 903 contains color attribute values 923, 925, 927, 929, 931, 933, 935, 937, 939, 941, 943, 945, 947, 949, 951, 953 and 955 associated with rules 1–17, respectively. Rows 904–921 are associated with rules 1–18, respectively. Rule 18 contains no specified attribute values.

The rules for size and color contain five specified sizes: extra small assigned to attribute values 922 and 924; small assigned to attribute values 926, 928, 930, 932 and 934; medium assigned to attribute values 936, 938, 940 and 942; large assigned to attribute values 944, 946, 948 and 950; and extra-large assigned to attribute values 952 and 954. Five color values are specified: white assigned to attribute values 923, 927, 937, 945 and 953; blue assigned to attribute values 925, 929, 939, 947 and 955; plaid assigned to attribute values 931, 941 and 949; striped assigned to attribute values 933, 943 and 951; and red assigned to attribute value 935.

According to the rules for size and color of the shirt product line, if an extra large shirt is specified, then rules 16 and 17 apply, limiting the colors available to white and blue, respectively. Similarly, if a striped shirt is initially selected, rules 6, 11 and 15 apply. According to rules 6, 11 and 15, striped shirts are available only in sizes small, medium and large, respectively.

In FIG. 10, the pant product line 1001 is selected in the first frame and the rule sets for pants are shown in the second frame comprising color and material rules 1002 followed by the global rule sets shown in italics. Color and material rules 1002 are selected in FIG. 10 resulting in the display of appropriate rules and the third frame of the GUI window. Column 1003 displays color attribute values 1015, 1017, 1019, 1021, 1023, 1025, 1027, 1029 and 1031 associated with rules 1–9, respectively. Column 1004 displays material attribute values 1016, 1018, 1020, 1022, 1024, 1026, 1028, 1030 and 1032 associated with rules 1–9, respectively. Rows 1005–1014 correspond to rules 1–10, respectively. Rule 10 has no specified attribute values.

Column 1003 contains six different color values: blue assigned to attribute value 1015; stone washed assigned to attribute value 1017; black assigned to attribute value 1019; white assigned to attribute values 1021 and 1031; tan assigned to attribute values 1023 and 1027; and tope assigned to attribute values 1025 and 1029. Column 1004 contains three different material values: denim assigned to attribute values 1016, 1018, 1020 and 1022; wool assigned to attribute values 1024 and 1026; and polyester assigned to attribute values 1028, 1030 and 1032.

According to the rules for pant color and material, if white pants are selected, then rules 4 and 9 apply. According to rules 4 and 9, only denim and polyester materials are available. Similarly, if wool material is specified, then rules 5 and 6 apply, limiting the colors available to tan and tope, respectively.

Figure 11:
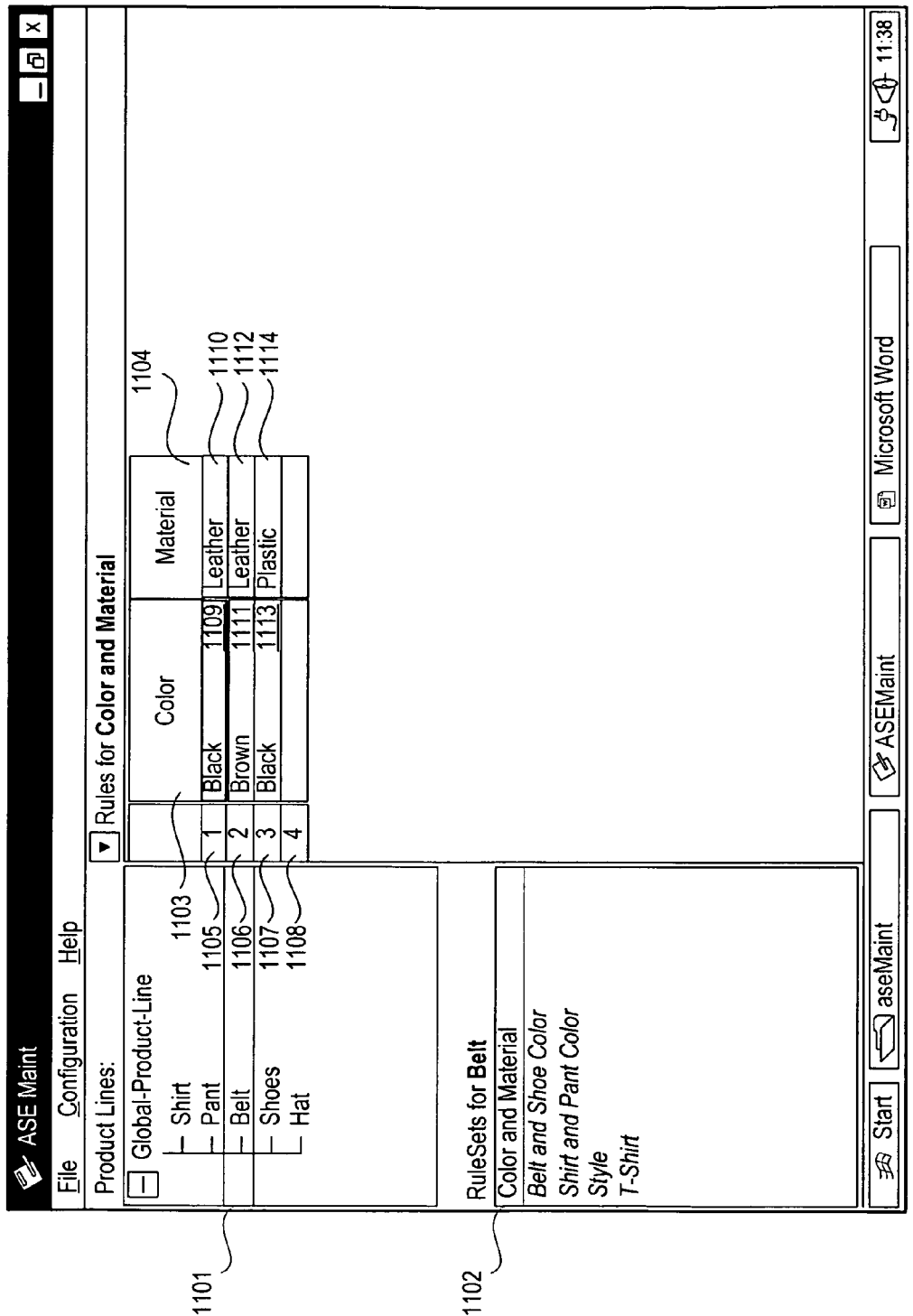

In FIG. 11, the belt product line 1101 is selected in the first frame of the GUI window, and the rule sets for the belt are displayed in the second frame. The rules specific to the belt product line are the color and material rules 1102 selected in the second frame. The third frame of the GUI window displays the rules for color and material for the belt product line. Column 1103 contains color attribute values 1109, 1111 and 1113 corresponding to rules 1–3, respectively. Column 1104 contains material attribute values 1110, 1112 and 1114 corresponding to rules 1–3, respectively. Rows 1105–1108 correspond to rules 1–4, respectively. Rule 4 contains no specified attribute values.

The color values designated under the rules are black, assigned to attribute values 1109 and 1113, and brown, assigned to attribute value 1111. The material values designated under the rules are leather, assigned to attribute values 1110 and 1112, and plastic, assigned to attribute value 1114.

If a black belt is selected, then according to rules 1 and 3, either leather or plastic material is available. However, if a brown belt is selected, according to rule 2, only leather material is available. Similarly, if leather material is initially selected, according to rules 1 and 2, belt colors black and brown are available. However, if a plastic material is selected, according to rule three, only a black belt is available.

Figure 12:
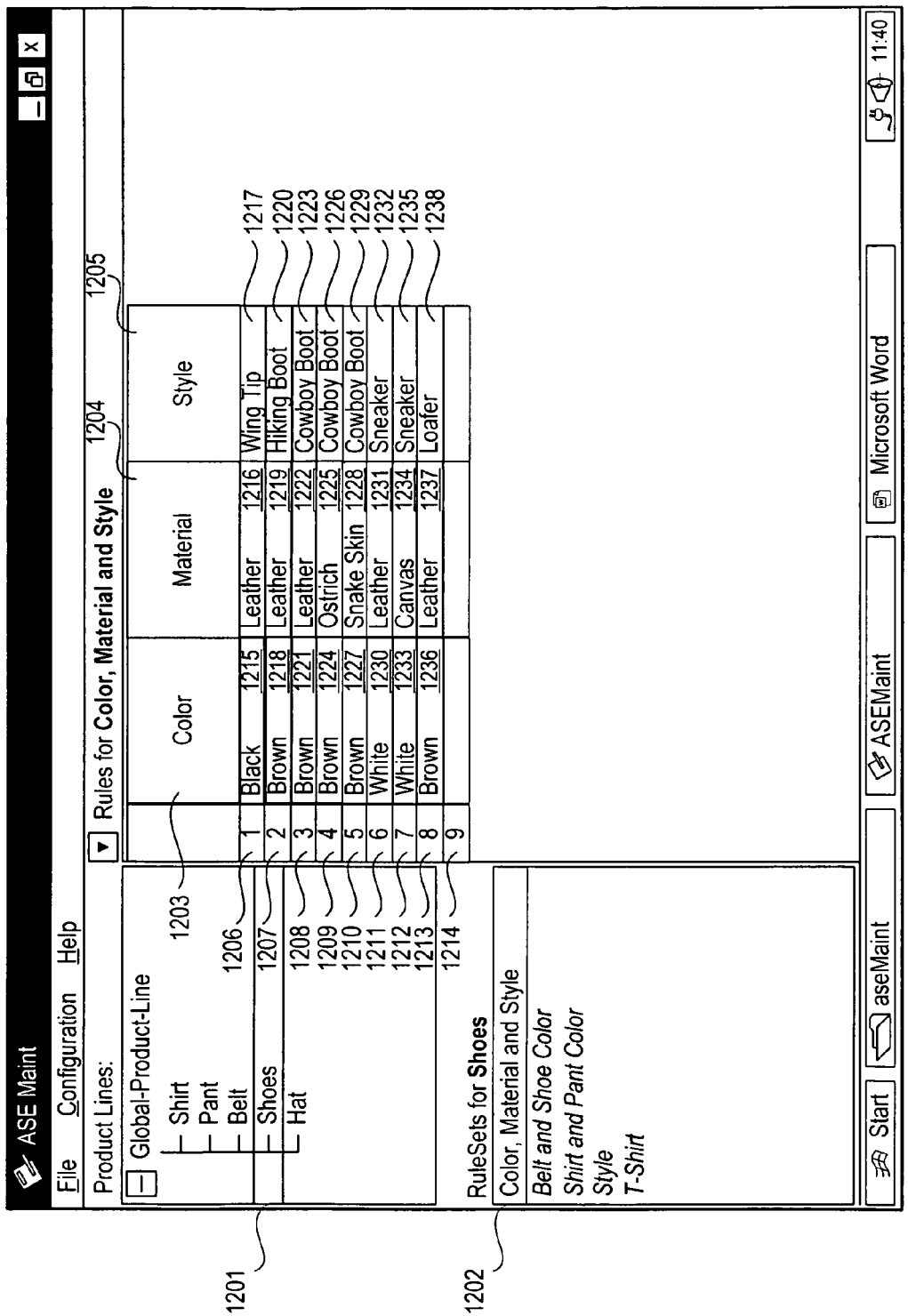

In FIG. 12, the shoes product line 1201 is selected in the first frame of the GUI window and the rule sets for the shoes product line are shown in the second frame of the window. The rules specific to the shoes product line are the color, material and style rules 1202 which are selected. The rules for color, material and style are shown in the third frame of the GUI window. Column 1203 contains color attribute values 1215, 1218, 1221, 1224, 1227, 1230, 1233 and 1236 associated with rules 1–8, respectively. Column 1204 contains material attribute values 1216, 1219, 1222, 1225, 1228, 1231, 1234 and 1237 associated with rules 1–8, respectively. Column 1205 contain style attribute values 1217, 1220, 1223, 1226, 1229, 1232, 1235 and 1238 associated with rules 1–8, respectively. Rows 1206–1214 correspond to rules 1–9, respectively. Rule 9 has no specified attribute values associated with it.

Three color values are specified in column 1203: black assigned to attribute value 1215; brown assigned to attribute values 1218, 1221, 1224, 1227 and 1236; and white assigned to attribute values 1230 and 1233. Four material values are specified in column 1204; leather assigned to attribute values 1216, 1219, 1222, 1231 and 1237; ostrich assigned to attribute value 1225; snake skin assigned to attribute value 1228; and canvas assigned to attribute value 1234. Five different styles are specified in column 1205: wing tip assigned to attribute value 1217; hiking boot assigned to attribute value 1220; cowboy boot assigned to attribute values 1223, 1226 and 1229; sneaker assigned to attribute values 1232 and 1235; and loafer assigned to attribute value 1238.

According to the rules FIG. 12, if brown shoes are selected, then rules 2–5 and 8 apply, limiting the styles of shoes to hiking boots, cowboy boots, or loafers. If the selection is further limited by selecting snake skin material, then the style of shoe is limited to cowboy boot by rule 5. Similarly, if the sneaker style of shoe is selected, according to rules 6 and 7, the color of shoe is limited to white, and the material is limited to leather or canvas.

For this example, in one embodiment, the "hat" product line is considered an accessory with no dependencies. Any hat may be selected with any assembly combination. Thus, no rules apply to hat attributes. With the absence of a hat attribute in any rule sets, the attribute selection engine classifies any hat selection as valid.

Flow Diagram

The operation of the invention of the present invention in analyzing rule sets to identify valid combinations from attribute values selected is described by reference to the flow diagram of FIGS. 2A through 2D. The process begins at start 200. The process continues in step 201, where selection of attributes and products is performed, and continues along path 212 to step 202. In step 202, a working set is created that contains all of the selections made. The working set represents the set of all selectable attribute values. Attribute values in the working set are indexed by attribute.

From step 202, the process continues at step 202.1 where a removal flag is set to value true and then along path 213 to step 203. In step 203, a pass through an iterative segment of the process begins. From step 203, the process continues to step 203.1 where the removal flag is set to value false, and then along path 215 to step 204. In step 204, attributes A in the working set are found. From step 204, the process continues along path 217 to step 205. In step 205, rule sets RS that reference attribute A and have not been processed on this pass of the working set are found. From step 205, the process continues along path 219 to step 206. In step 206, bindings of rule set RS are found. From step 206, the process continues along path 221 to reference A 211.

Figure 2A:
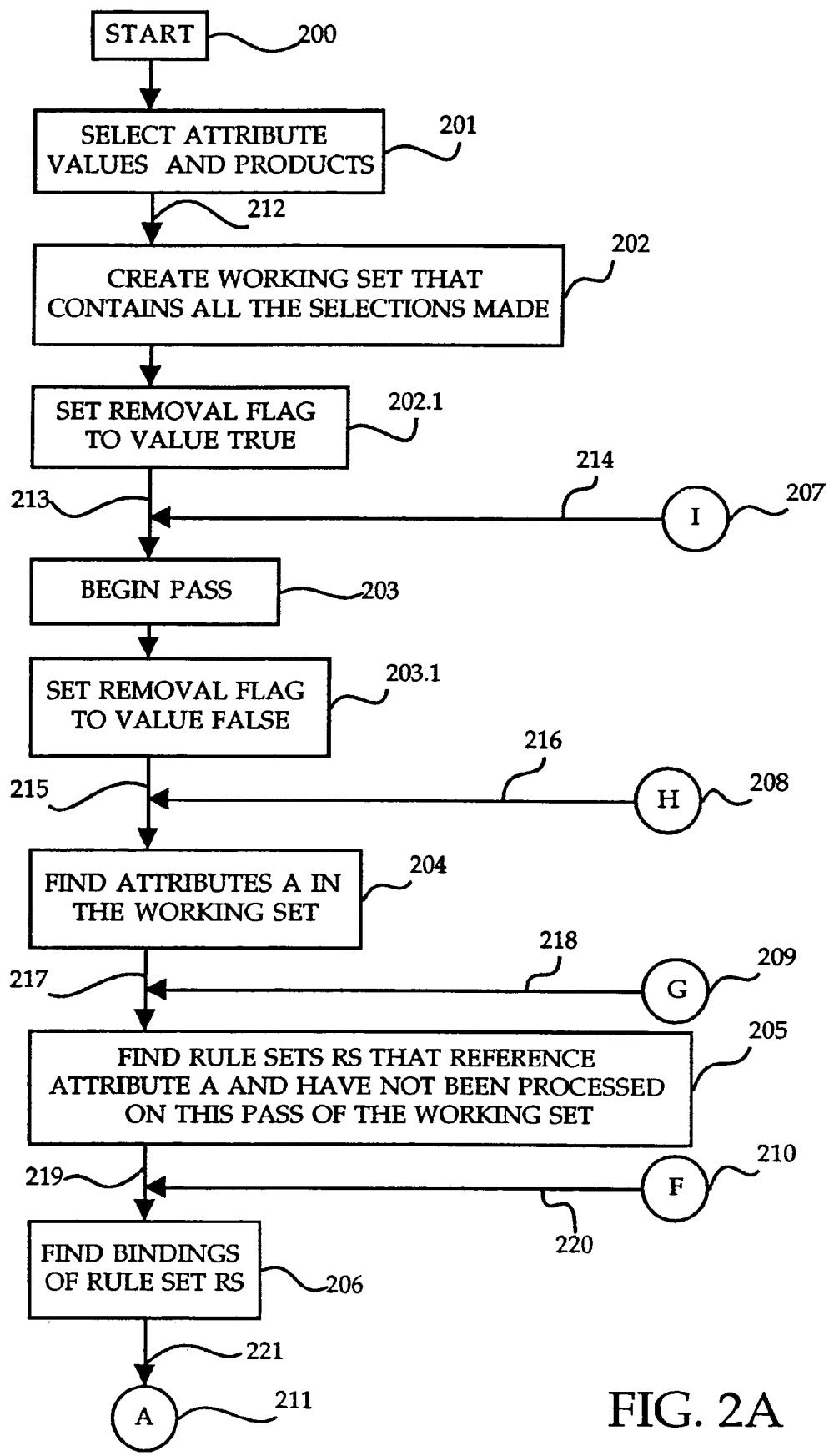
FIGS. 2A, 2B, 2C, and 2D illustrate a flowchart of the present invention.
Figure 2B:
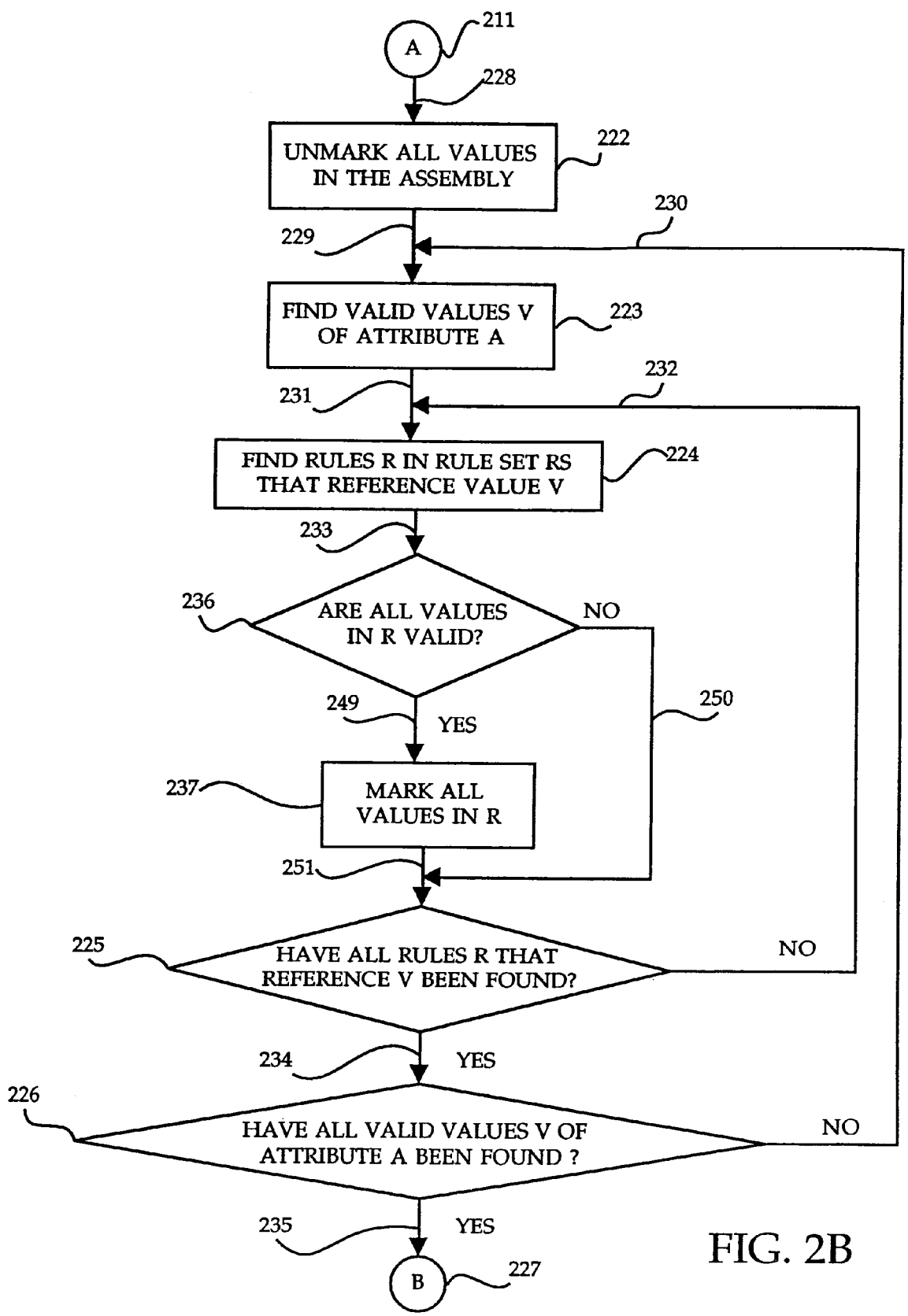

In FIG. 2B, the process continues from reference A 211 to step 222 along path 228. In step 222, all values in the assembly are unmarked. From step 222, the process continues along path 229 to step 223. In step 223, valid values V of attribute A are found. From step 223, the process continues along path 231 to step 224. In step 224, Rules R in Rule Set RS that reference value V are found. From step 224, the process continues along path 233 to step 236 and a test to determine if all values in R are valid. If not, proceed along path 250 to step 225. If yes, proceed to step 237 and mark all values in R. Then proceed to step 225. In step 225, a test is performed as to whether or not all rules R that reference V have been found. If not, the process returns to step 224 via path 232. If, however, all rules R that reference V have been found, the process continues along path 234 to step 226.

In step 226, a test is performed as to whether or not all valid values V of attribute A have been found. If not, the process returns to step 223 via path 230. If, however, all valid values V of attribute A have been found, the process continues along path 235 to reference B 227.

Figure 2C:
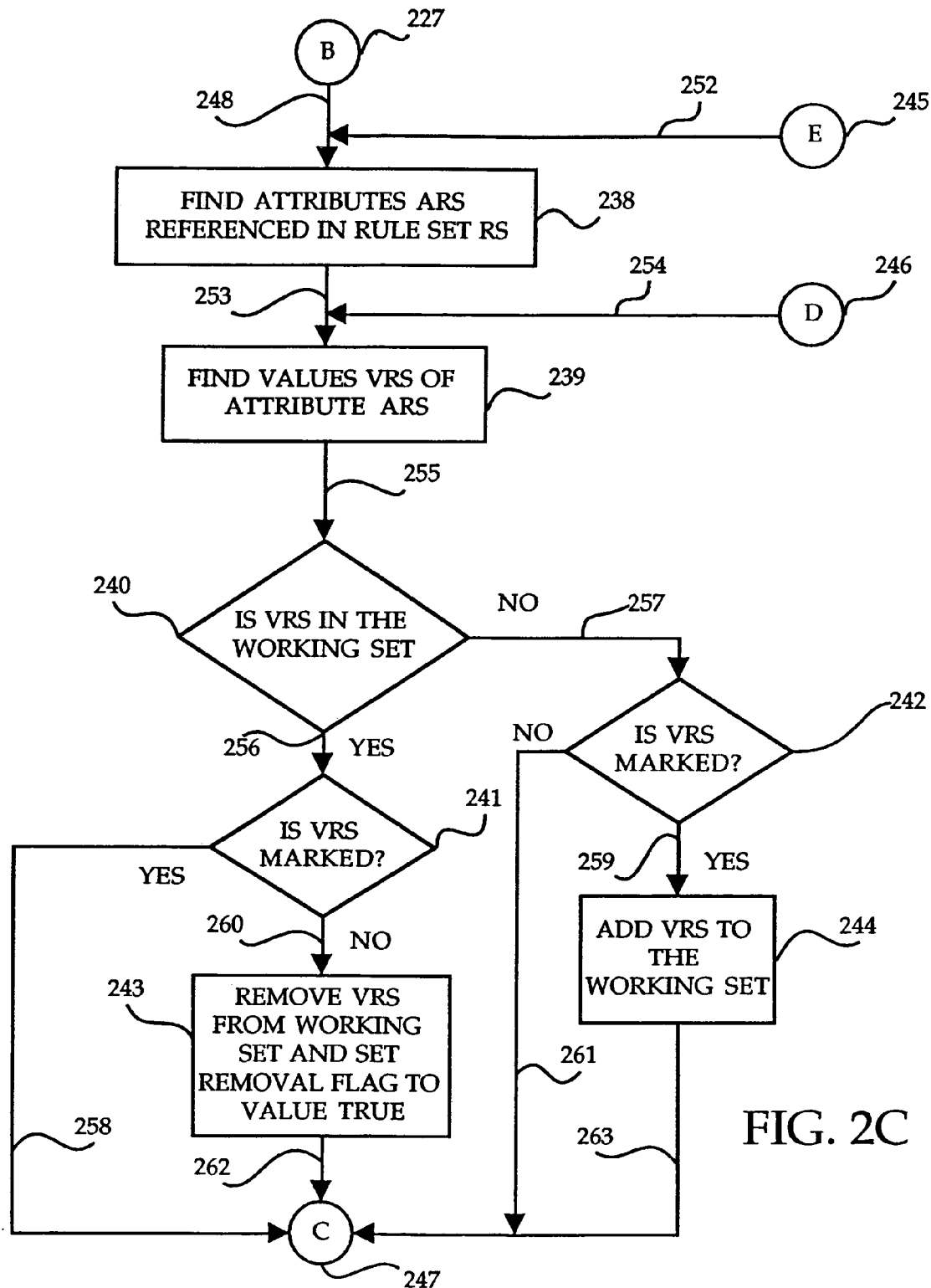

In FIG. 2C, the process continues from reference B 227 to step 238. In step 238, attributes ARS referenced in rule set RS are found. From step 238, the process continues along path 253 to step 239. In step 239, values VRS of attribute ARS are found. From step 239, the process continues along path 255 to step 240. In step 240, a test is performed as to whether or not VRS is in the working set. If VRS is in the working set, the process continues along path 256 to step 241. In step 241, a test is performed as to whether or not VRS is marked. If VRS is marked, the process continues to reference C 258. If VRS is not marked, the process continues along path 260 to step 243. In step 243, VRS is removed from the working set and the removal flag value is set to true. From step 243, the process continues to reference C 247.

In step 240, if VRS is not in the working set, the process continues along path 257 to step 242. In step 242, a test is performed as to whether or not VRS is marked. If VRS is not marked, the process continues along path 261 to reference C 247. If VRS is marked, the process continues along path 259 to step 244. In step 244, VRS is added to the working set. From step 244, the process continues to reference C 247.

Figure 2D:
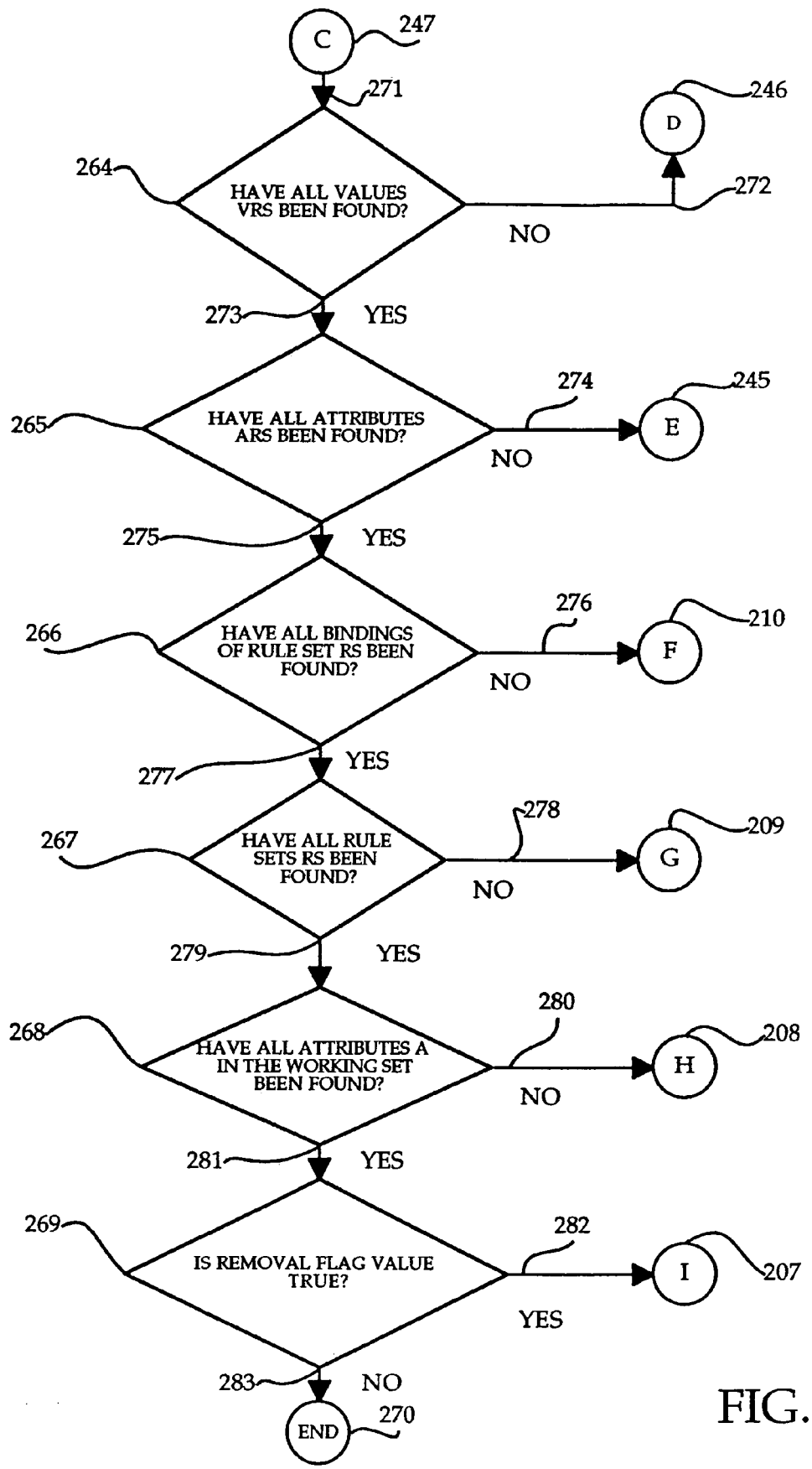

In FIG. 2D, the process continues from reference C 247 to step 264 along path 271. In step 264, a test is performed as to whether or not all values of VRS have been found. If not, the process continues along path 272 to reference D 246 and, in FIG. 2C, from reference D 246 along path 254 to step 239. If, in step 264, all values VRS have been found, the process continues along path 273 to step 265. In step 265, a test is performed as to whether or not all attributes ARS have been found. If not, the process continues along path 274 to reference E 245, and in FIG. 2C, from reference E 245 along path 252 to step 238.

If, in step 265, all attributes ARS have been found, the process continues along path 275 to step 266. In step 266, a test is performed as to whether or not all bindings of rule set RS have been found. If not, the process continues along path 276 to reference F 210, and, in FIG. 2A, from reference F 210 along path 220 to step 206. If, in step 266, all bindings of rule set RS have been found, the process continues along path 277 to step 267.

In step 267, a test is performed as to whether or not all rule sets RS have been found. If not, the process continues along path 278 to reference G 209, and, in FIG. 2A, from reference G 209 along path 218 to step 205. If, in step 267, all rule sets RS have been found, the process continues along path 279 to step 268.

In step 268, a test is performed as to whether or not all attributes A in the working set have been found. If not, the process continues along path 280 to reference H 208, and, in FIG. 2A, from reference H 208 along path 216 to step 204. If, in step 268, all attributes A in the working set have been found, the process continues along path 281 to step 269.

In step 269, a test is performed as to whether the removal flag is value true. If the removal flag is value true, the process continues along path 282 to reference 1207, and, in FIG. 2A, from reference 1207 along path 214 to step 203 and begins a new pass. If, in step 269, the removal flag is not value true, the process continues along path 283 to step 270. The process ends in step 270.

ALTERNATE EMBODIMENT

Pseudocode for another embodiment of the invention is shown below:

```
Create a working set that contains all the selections made. After the
process is completed, the working set represents the set of attribute
values that will be selectable upon completion. Attribute values in the
working set are indexed by attribute. If there are no values for an
attribute in the working set, then all values of that attribute are
considered to be valid.
Set the removal flag to the value true.
While the removal flag is value true.
    Set removal flag to value false
    For all attributes A in the working set.
        For all rule sets RS, which reference A and have not been visited
        on this pass of the working set.
            For all bindings of rule set RS. (This step is only important
            for interproduct rule sets where aliases of columns are
            bound to products in the assembly.)
                For all attributes ARS in rule set RS and not in the
                working set
                    For all values VRS of attribute ARS
                        Insert VRS into the working set
                    End for all values VRS
                End for all attributes ARS
                Unmark all values in the assembly.
                For all values V of attribute A found in the
                working set.
                    For all rules R in rule set RS which reference
                    V.
                        If all values in R are found in the
                        working set, then mark in the working
                        set all the values found in R
                    End for all R.
                End for all V.
                For all attributes ARS referenced in the rule set RS.
                    For all the values VRS of attribute ARS.
                        If VRS is in the working set, and not
                        marked, then remove it and set removal flag
                        to value true.
                    End for all VRS.
                End for all ARS.
            End for all bindings.
        End for all RS.
    End for all A.
End while.
```

FIGS. 13A through 13E are flow diagrams that illustrate a process according to this alternate embodiment of the present invention. The process begins in step 1301, and continues along path 1339 to step 1302, where selection of attribute and products is performed. From step 1302, the process continues along path 1340 to step 1303. In step 1303, a working set is created that contains all of the selections made. The working set represents the set of all selectable attribute values. Attribute values in the working set are indexed by attribute. If an attribute value exists in the working set, that attribute value is valid. If there are no values for an attribute in the working set, then all values of that attribute are considered to be valid.

From step 1303, the process continues to step 1303.1 and a removal flag is set to value true, then continues along path 1341 to step 1304. In step 1304, a pass through an iterative segment of the process begins. From step 1304, the process continues to step 1304.1 and the removal flag is set to value false, then continues along path 1343 to step 1305. In step 1305, attributes A in the working set are found. From step 1305, the process continues along path 1345 to step 1306. In step 1306, rule sets RS that reference attribute A and have not been processed on this pass of the working set are found. From step 1306, the process continues along path 1347 to step 1307. In step 1307, bindings of rule set RS are found. From step 1307, the process continues along path 1349 to reference A 1333.

Figure 13A:
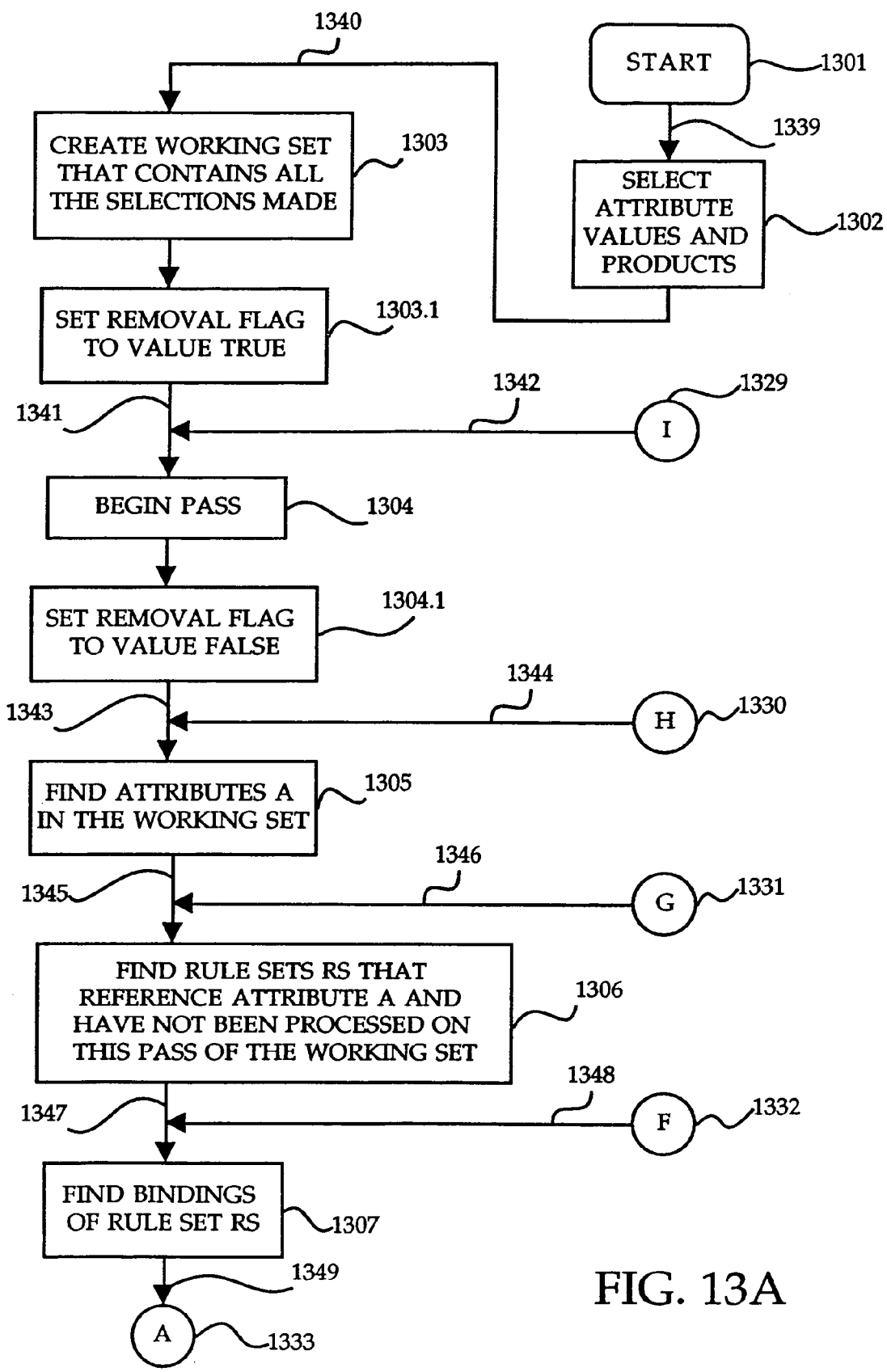
FIGS. 13A–13E illustrate a flow chart of an alternate embodiment of the invention.
Figure 13B:
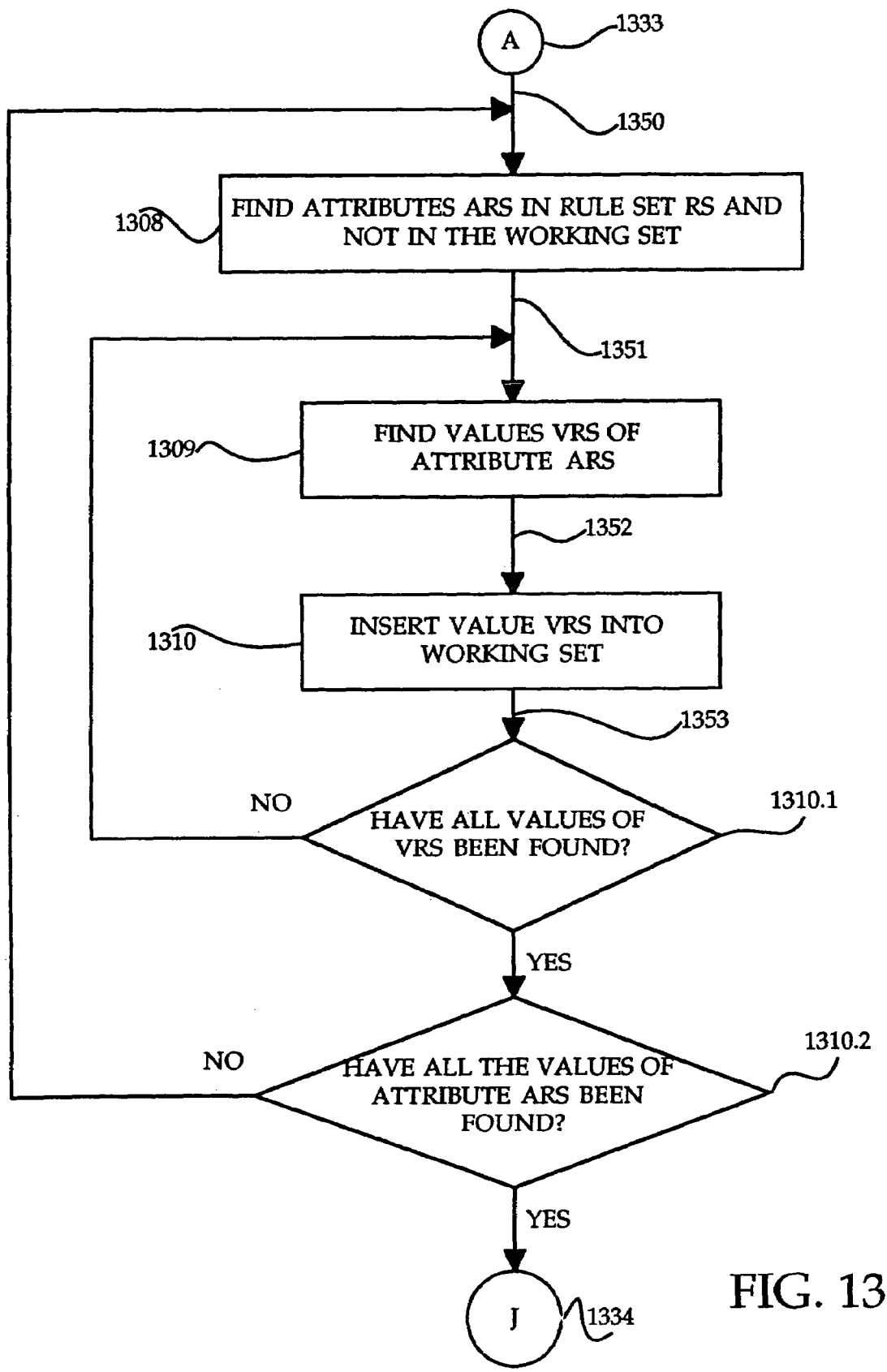

In FIG. 13B, the process continues from reference A 1333 to step 1308 along path 1350. In step 1308, attributes ARS in rule set RS and not in the working set are found. From step 1308, the process continues via path 1351 to step 1309. In step 1309, values VRS of attributes ARS are found. From step 1309, the process continues via path 1352 to step 1310. In step 1310, value VRS is inserted into the working set. From step 1310, the process continues to step 1310.1. At step 1310.1 a test is made to determine if all values of VRS have been found. If all values have not been found, the process returns to step 1309. If all values have been found, proceed to step 1310.2. At step 1310.2 a test is made to determine if all the values of attribute ARS have been found. If they have not been found return to step 1308. If they have been found, proceed to reference J 1334.

Figure 13C:
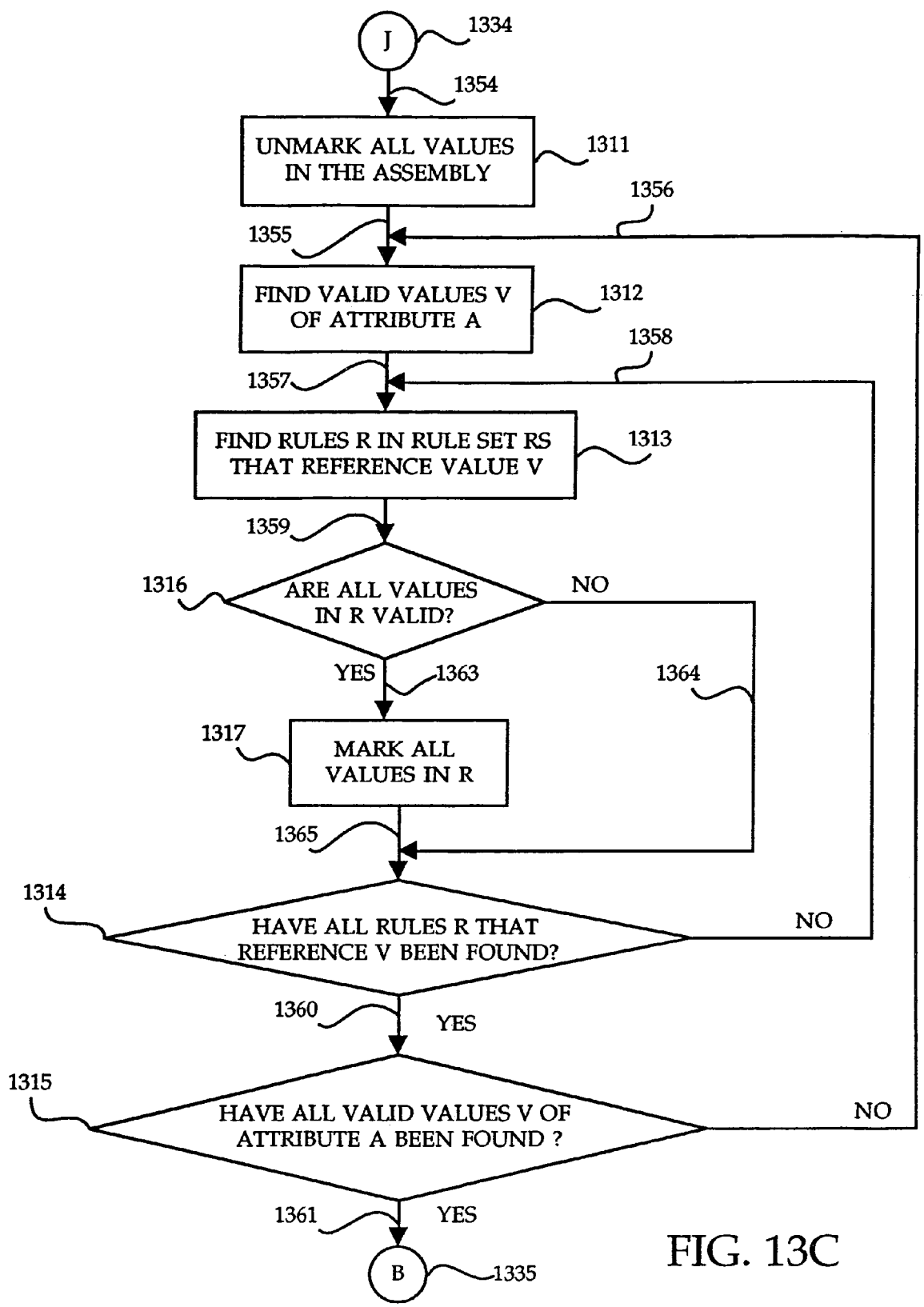

In FIG. 13C, the process continues from reference J 1334 via path 1354 to step 1311. In step 1311, all values in the assembly are unmarked. From step 1311, the process continues along path 1355 to step 1312. In step 1312, valid values V of attribute A are found. From step 1312, the process continues along path 1357 to step 1313. In step 1313, rules R in ruleset RS that reference value V are found. From step 1313, the process continues to step 1316. At step 1316, a test is performed as to whether or not all values in R are valid. If so, the process continues along path 1363 to step 1317. In step 1317, all values in R are marked. From step 1317, the process continues along path 1365 to step 1318. If, in step 1316, not all values in R are valid, the process continues along path 1364 to step 1314, bypassing step 1317. In step 1314, a test is performed as to whether or not all rules R that reference V have been found. If not, the process returns to step 1313 via path 1358. If, however, all rules R that reference V have been found, the process continues along path 1360 to step 1315.

In step 1315, a test is performed as to whether or not all valid values V of attribute A have been found. If not, the process returns to step 1312 via path 1356. If, however, all valid values V of attribute A have been found, the process continues along path 1361 to reference B 1335.

Figure 13D:
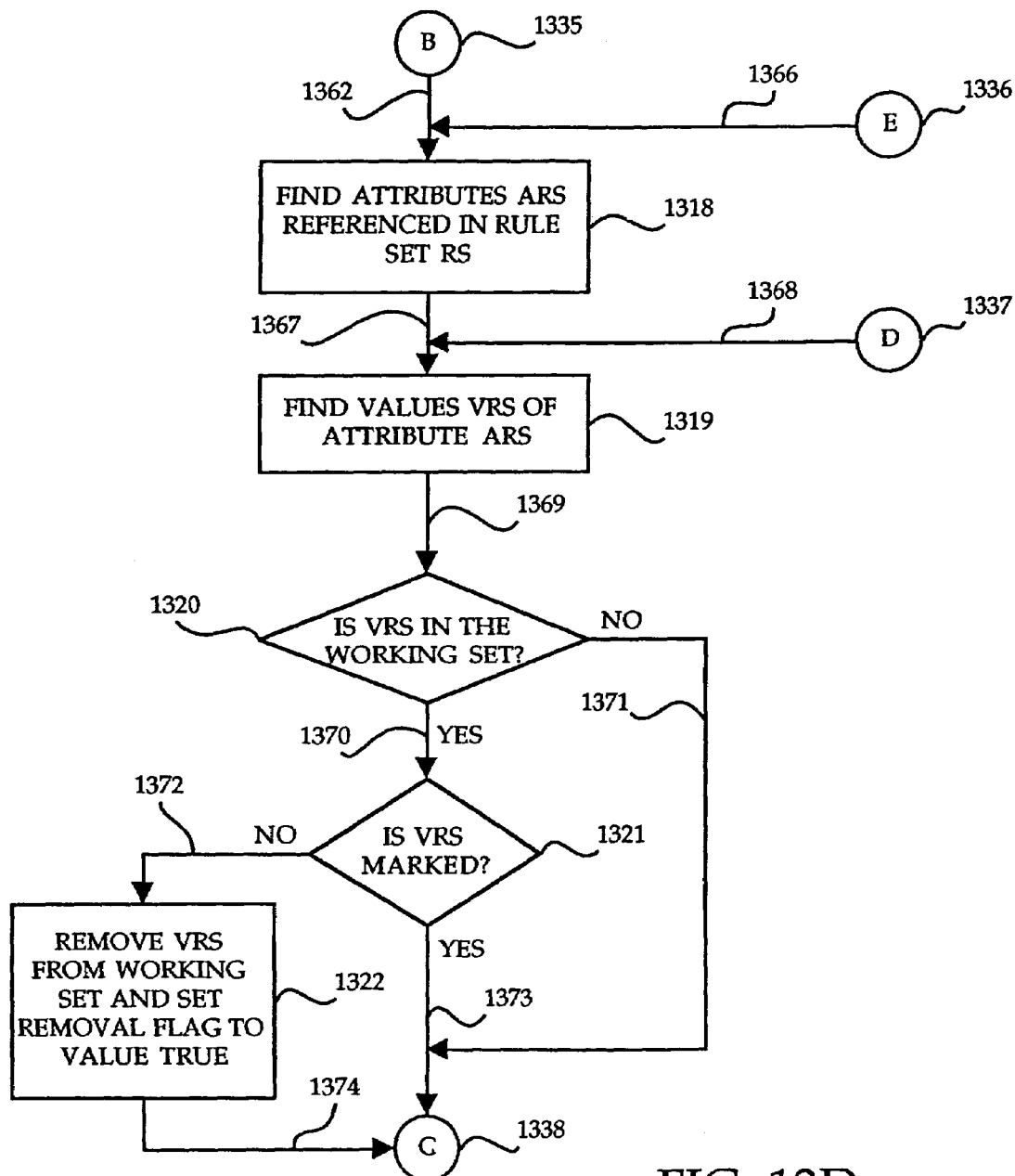

In FIG. 13D, the process continues from reference B 1335 to step 1318. In step 1318, attributes ARS referenced in rule set RS are found. From step 1318, the process continues along path 1367 to step 1319. In step 1319, values VRS of attribute ARS are found. From step 1319, the process continues along path 1369 to step 1320. In step 1320, a test is performed as to whether or not VRS is in the working set. If VRS is not in the working set, the process continues along path 1371 to reference C413. In step 1320, if VRS is in the working set, the process continues along path 1370 to step 1321. In step 1321, a test is performed as to whether or not VRS is marked. If VRS is marked, the process continues along path 1373 to reference C 1338. If VRS is not marked, the process continues along path 1372 to step 1322. In step 1322, VRS is removed from the working set and the removal flag to value true. From step 1322, the process continues along path 1374 to reference C 1338.

Figure 13E:
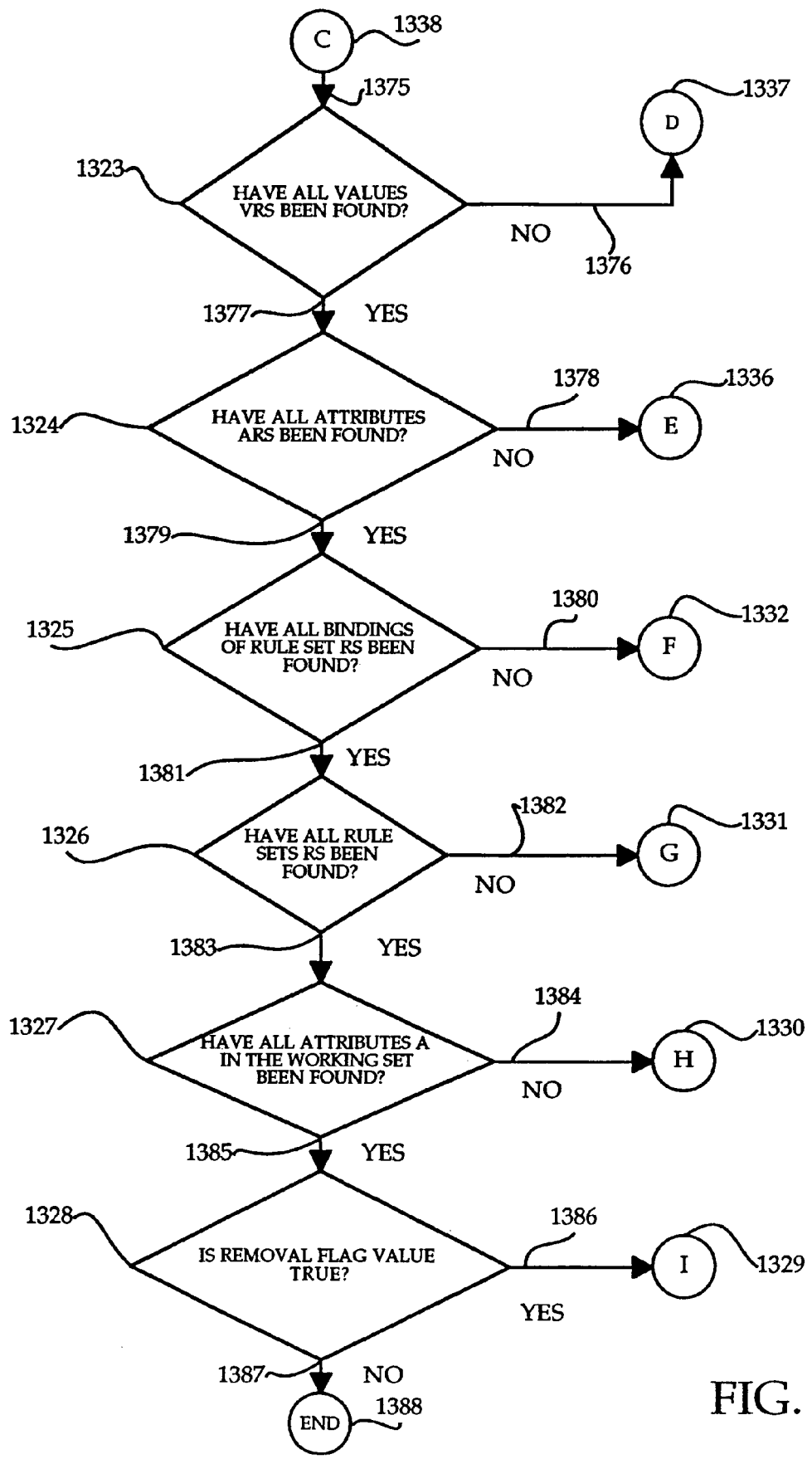

In FIG. 13E, the process continues from reference C 1338 to step 1323 along path 1375. In step 1323, a test is performed as to whether or not all values of VRS have been found. If not, the process continues along path 1376 to reference D 1337, and, in FIG. 13D, from reference D 1337 along path 1368 to step 1319. If, in step 1323, all values VRS have been found, the process continues along path 1377 to step 1324. In step 1324, a test is performed as to whether or not all attributes ARS have been found. If not, the process continues along path 1378 to reference E 1336, and in FIG. 13D, from reference E 1336 along path 1366 to step 1318.

If, in step 1324, all attributes ARS have been found, the process continues along path 1379 to step 1325. In step 1325, a test is performed as to whether or not all bindings of rule set RS have been found. If not, the process continues along path 1380 to reference F 1332, and, in FIG. 13A, from reference F 1332 along path 1348 to step 1307. If, in step: 1325, all bindings of rule set RS have been found, the process continues along path 1381 to step 1326.

In step 1326, a test is performed as to whether or not all rule sets RS have been found. If not, the process continues along path 1382 to reference G 1331, and, in FIG. 13A, from reference G 1331 along path 1346 to step 1306. If, in step 1326, all rule sets RS have been found, the process continues along path 1383 to step 1327.

In step 1327, a test is performed as to whether or not all attributes A in the working set have been found. If not, the process: continues along path 1384 to reference H 1330, and, in FIG. 13A, from reference H 1330 along path 1344 to step 1305. If, in step 1327, all attributes A in the working set have been found, the process continues along path 1385 to step 1328.

In step 1328, a test is performed as to whether the removal flag value is true. If true, the process continues along path 1386 to reference 11329, and, in FIG. 13A, from reference 11329 along path 1342 to step 1304 and begins a new pass. If, in step 1328, the value is false, the process continues along path 1387 to step 1388. The process ends in step 1388.

Working Set

The present invention makes reference to the generation of a "working set" during analysis of the rule sets of the attributes under consideration. The working set represents the set of all selectable attribute values. Attribute values in the working set are indexed by attribute. If an attribute value exists in the working set, that attribute value is valid.

In one embodiment of the present invention, the working list is implemented as a "tree" structure with a level of nodes representing attributes of a product. Each node has a linked list of attribute values each associated with a flag. During passes through the method of the present invention, flags are set or disabled as appropriate so that, on completion of a pass, values that were not marked can be easily removed. On completion of the algorithm, the working set represents the set of selectable attribute values.

Figure 20:
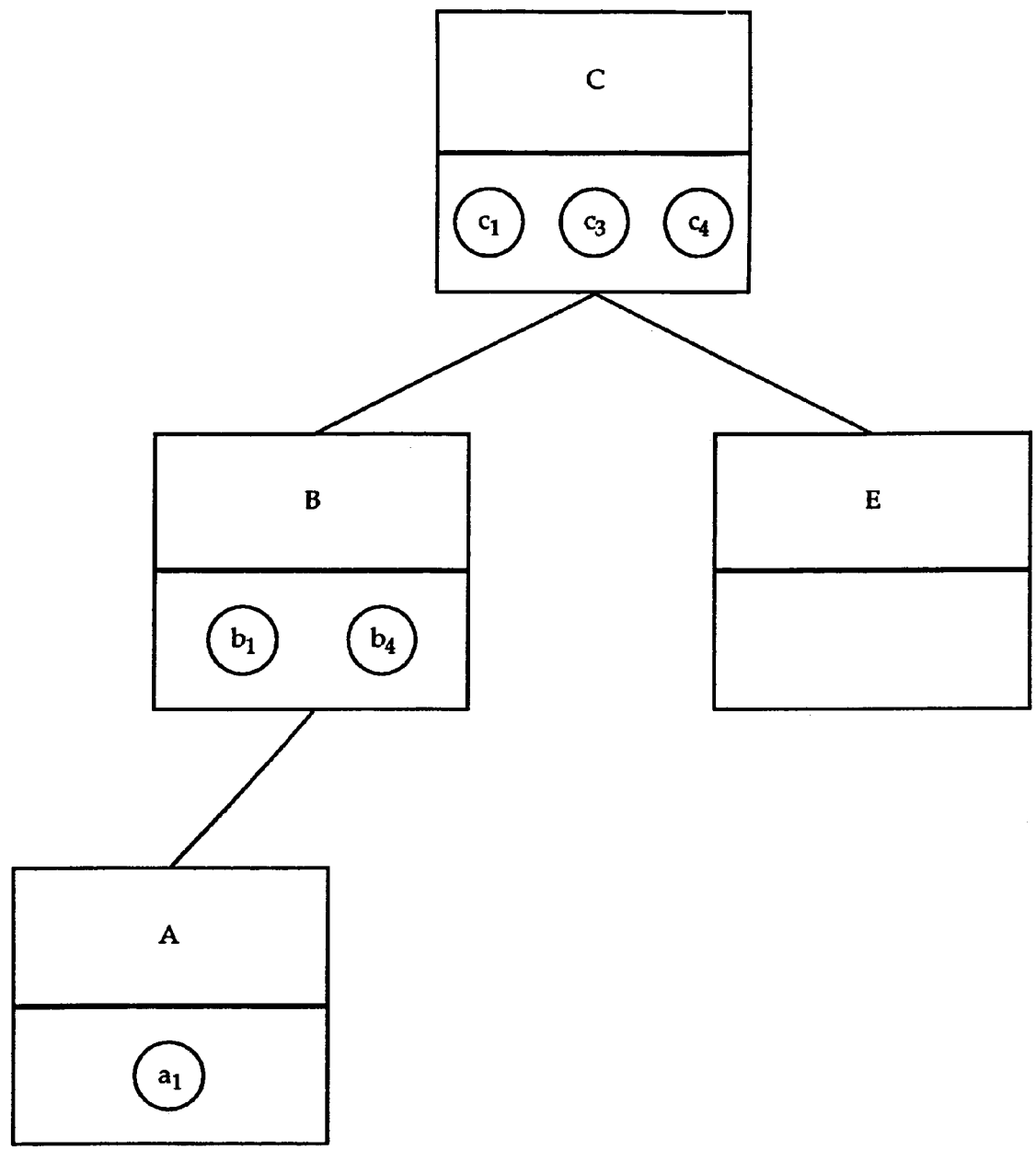
FIG. 20 is a diagram of an embodiment of a working set of the present invention.

An example of a working set is illustrated in FIG. 20. The working set assumes attributes A, B, C, D, and E. The rectangular enclosures each represent a node in a tree that is associated with an attribute. In the example of FIG. 20, attributes A, B, C and E have nodes in the tree. Attribute D does not have a node in the tree of the working set (Note that every attribute value of attribute D is valid). Each circular enclosure is a node in a link list containing attribute values of the associated attribute and a mark flag.

From the example of FIG. 20, valid attribute values are a1, b1, b4, c1, c3, c4, and d1–dn. Note that no attribute values from attribute E are valid.

Thus, a method and apparatus for configuring systems by selecting attribute values has been described.

The invention claimed is:

1. A method for selecting attribute values comprising the steps of:

accessing a rule set comprising rules;

creating a working set comprising a representation of selectable attribute values;
accepting proposed selected attribute values;
identifying valid attribute values in said rules;
providing a first indication associated with each of said valid attribute values;
identifying attributes referenced in said rule set; and
determining whether values of said attributes referenced in said rule set are present in said working set and whether said first indication is associated with said values of said attributes referenced in said rule set, if said values are present in said working set and said second first indication is not associated with said values, removing said values from said working set.

2. The method of claim 1 further comprising:
adding said values to said working set, if said values of said attributes referenced in said rule set are not present in said working set and said first indication is associated with said values.

3. The method of claim 1 further comprising:
for each of a plurality of rule sets, repeating (i) identifying valid attribute values, providing a first indication, (ii) identifying attributes, and (iii) determining whether values of said attributes referenced in said rule set are present in said working set and whether said first indication is associated with said values of said attributes referenced in said rule set.

4. The method of claim 1 further comprising:
configuring a product, wherein said rules of said rule set specify an interrelation for said product of said attribute values referenced in said rule set.

5. The method of claim 1 further comprising:
configuring a plurality of products using interproduct rule sets, wherein said rules of said rule set specify an interrelation between said products of said attribute values referenced in said rule sets.

6. The method of claim 5 wherein said products are included in an assembly of products, the method further comprising the steps of:
identifying bindings of said rule set, wherein said bindings define relations between said products in said assembly; and
for each of said bindings of said rule set, repeating (i) identifying valid attribute values, providing a first indication, (ii) identifying attributes, and (iii) determining whether values of said attributes referenced in said rule set are present in said working set and whether said first indication is associated with said values of said attributes referenced in said rule set.

7. A data storage medium comprising computer readable code, wherein the computer readable code is executable by a computer for:
accessing a rule set comprising rules;
creating a working set comprising a representation of selectable attribute values;
accepting proposed selected attribute values;
identifying valid attribute values in said rules;
providing a first indication associated with each of said valid attribute values;
identifying attributes referenced in said rule set; and
determining whether values of said attributes referenced in said rule set are present in said working set and whether said first indication is associated with said values of said attributes referenced in said rule set, if said values are present in said working set and said first indication is not associated with said values, removing said values from said working set.

8. The computer readable medium of claim 7 wherein the computer readable code is further executable by a computer for:
adding said values to said working set if said values of said attributes referenced in said rule set are not present in said working set and said first indication is associated with said values.

9. The computer readable medium of claim 7 wherein the computer readable code is further executable by a computer for:
repeating, for each of a plurality of rule sets, identifying valid attribute values, providing a first indication, identifying attributes, and determining whether values of said attributes referenced in said rule set are present in said working set and whether said first indication is associated with said values of said attributes referenced in said rule set.

10. The computer readable medium of claim 7 wherein the computer readable code is further executable by a computer for:
configuring a product, wherein said rules of said rule set specify an interrelation for said product of said attribute values referenced in said rule set.

11. The computer readable medium of claim 7 wherein the computer readable code is further executable by a computer for:
configuring a plurality of products using interproduct rule sets, wherein said rules of said rule set specify an interrelation between said products of said attribute values referenced in said rule sets.

12. The computer readable medium of claim 11 wherein said products are included in an assembly of products, the computer readable code is further executable by a computer for:
identifying bindings of said rule set, wherein said bindings define relations between said products in said assembly; and
for each of said bindings of said rule set, repeating identifying valid attribute values, providing a first indication, identifying attributes, and determining whether values of said attributes referenced in said rule set are present in said working set and whether said first indication is associated with said values of said attributes referenced in said rule set.

13. A system comprising:
a processor; and
a memory coupled to the processor, the memory having code executable by the processor for:
accessing a rule set comprising rules;
creating a working set comprising a representation of selectable attribute values;
accepting proposed selected attribute values;
identifying valid attribute values in said rules;
providing a first indication associated with each of said valid attribute values;
identifying attributes referenced in said rule set; and
determining whether values of said attributes referenced in said rule set are present in said working set and whether said first indication is associated with said values of said attributes referenced in said rule set, if said values are present in said working set and said first indication is not associated with said values, removing said values from said working set.

14. The system of claim 13 wherein the code is further executable by the processor for:
- adding said values to said working set if said values of said attributes referenced in said rule set are not present in said working set and said first indication is associated with said values.

15. The system of claim 13 wherein the code is further executable by the processor for:
- repeating, for each of a plurality of rule sets, (i) identifying valid attribute values, providing a first indication, (ii) identifying attributes, and (iii) determining whether values of said attributes referenced in said rule set are present in said working set and whether said first indication is associated with said values of said attributes referenced in said rule set.

16. The system of claim 13 wherein the code is further executable by the processor for:
- configuring a product, wherein said rules of said rule set specify an interrelation for said product of said attribute values referenced in said rule set.

17. The system of claim 13 wherein the code is further executable by the processor for:
- configuring a plurality of products using interproduct rule sets, wherein said rules of said rule set specify an interrelation between said products of said attribute values referenced in said rule sets.

18. The system of claim 17 wherein said products are included in an assembly of products, the code is further executable by the processor for:
- identifying bindings of said rule set, wherein said bindings define relations between said products in said assembly; and
- for each of said bindings of said rule set, repeating identifying valid attribute values, providing a first indication, identifying attributes, and determining whether values of said attributes referenced in said rule set are present in said working set and whether said first indication is associated with said values of said attributes referenced in said rule set.

19. An apparatus comprising:

means for accessing a rule set comprising rules;

means for creating a working set comprising a representation of selectable attribute values;

means for accepting proposed selected attribute values;

means for identifying valid attribute values in said rules;

means for providing a first indication associated with each of said valid attribute values;

means for identifying attributes referenced in said rule set; and means for determining whether values of said attributes referenced in said rule set are present in said working set and whether said first indication is associated with said values of said attributes referenced in said rule set, if said values are present in said working set and said first indication is not associated with said values, removing said values from said working set.

20. The apparatus of claim 19 further comprising:

means for configuring a product, wherein said rules of said rule set specify an interrelation for said product of said attribute values referenced in said rule set.

* * * * *